(12) United States Patent
Hamamoto et al.

(10) Patent No.: US 7,129,458 B2
(45) Date of Patent: *Oct. 31, 2006

(54) IMAGE PICKUP DEVICE, RADIATION IMAGE PICKUP DEVICE AND IMAGE PROCESSING SYSTEM

(75) Inventors: Osamu Hamamoto, Kanagawa (JP); Yoshinori Shimamura, Kanagawa (JP); Noriyuki Kaifu, Tokyo (JP); Kazuaki Tashiro, Kanagawa (JP); Tetsunobu Kochi, Kanagawa (JP); Osamu Yuki, Tokyo (JP); Kenji Kajiwara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/923,810

(22) Filed: Aug. 24, 2004

(65) Prior Publication Data

US 2005/0023438 A1    Feb. 3, 2005

Related U.S. Application Data

(62) Division of application No. 09/900,035, filed on Jul. 9, 2001, now Pat. No. 6,800,836.

(30) Foreign Application Priority Data

| Jul. 10, 2000 | (JP) | ............................. 2000-208306 |
| Jul. 18, 2000 | (JP) | ............................. 2000-217444 |
| Aug. 8, 2000 | (JP) | ............................. 2000-240184 |
| Aug. 8, 2000 | (JP) | ............................. 2000-240185 |
| Jun. 15, 2001 | (JP) | ............................. 2001-182222 |

(51) Int. Cl.
H01L 27/00 (2006.01)
H01L 31/00 (2006.01)

(52) U.S. Cl. ............................. 250/208.1; 250/214.1; 257/448

(58) Field of Classification Search ............. 250/208.1, 250/214 R, 214.1, 370.08; 257/448, 10, 257/53, 184, 225, 257, 290–291, 84; 313/365; 378/167, 195
See application file for complete search history.

(56) References Cited

U.S. PATENT DOCUMENTS

| 4,810,881 A | 3/1989 | Berger et al. .......... 250/370.01 |
| 5,187,378 A | 2/1993 | Takiguchi .................... 257/188 |

(Continued)

Primary Examiner—Stephone B. Allen
Assistant Examiner—Patrick J. Lee
(74) Attorney, Agent, or Firm—Fitzpatrick, Cella, Harper & Scinto

(57) ABSTRACT

An image pickup device has a plurality of photoelectric converter substrates carrying respective input/output terminals connected to the photoelectric converters. The device comprises leads connected to the input/output terminals and extending to the side opposite to the light receiving surfaces of the photoelectric converter substrates thorough the gaps separating the substrates.

1 Claim, 25 Drawing Sheets

U.S. PATENT DOCUMENTS

| | | |
|---|---|---|
| 5,428,237 A | 6/1995 | Yuzurihara et al. ......... 257/349 |
| 5,591,963 A | 1/1997 | Takeda et al. ............ 250/214.1 |
| 5,612,230 A | 3/1997 | Yuzurihara et al. ......... 438/164 |
| 5,635,718 A | 6/1997 | DePuydt et al. ........ 250/370.09 |
| 5,811,799 A | 9/1998 | Wu ............................. 250/239 |
| 5,835,045 A | 11/1998 | Ogawa et al. ............... 341/155 |
| 5,841,685 A | 11/1998 | Kochi ........................ 708/801 |
| 5,847,669 A | 12/1998 | Kochi ........................ 341/172 |
| 5,903,043 A | 5/1999 | Ichikawa et al. ............ 257/532 |
| 6,049,074 A | 4/2000 | Endo et al. .............. 250/208.1 |
| 6,075,256 A | 6/2000 | Kaifu et al. ................... 257/53 |
| 6,080,997 A | 6/2000 | Tashiro et al. ................ 257/28 |
| 6,166,583 A | 12/2000 | Kochi et al. ................ 327/407 |
| 6,483,184 B1 | 11/2002 | Murata ....................... 257/698 |
| 6,548,880 B1 | 4/2003 | Hirasawa .................... 257/433 |
| 6,586,824 B1 | 7/2003 | Glenn et al. ................ 257/680 |
| 6,800,836 B1* | 10/2004 | Hamamoto et al. ...... 250/208.1 |
| 6,800,857 B1* | 10/2004 | Kajiwara et al. ........... 250/368 |
| 2002/0005489 A1* | 1/2002 | Kasuyama et al. ......... 250/368 |
| 2002/0017611 A1 | 2/2002 | Tashiro et al. ......... 250/370.11 |

* cited by examiner

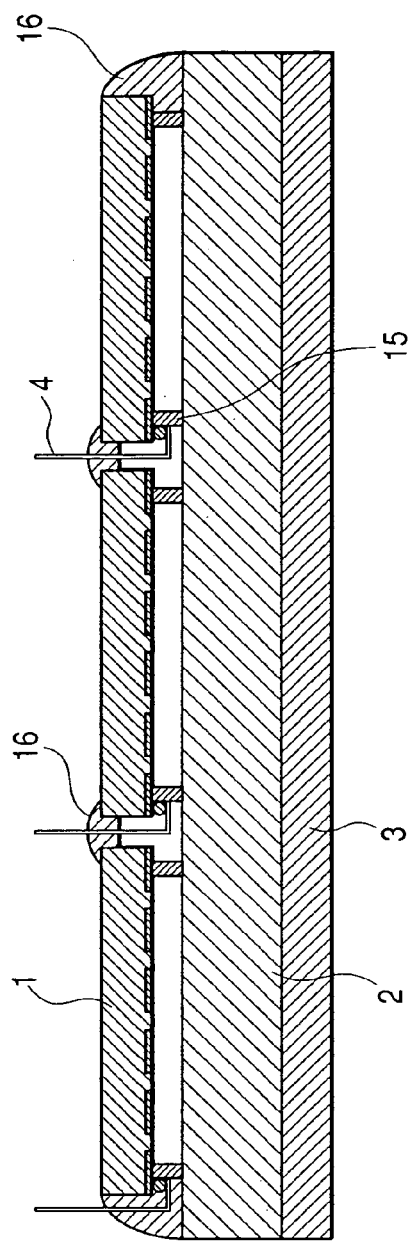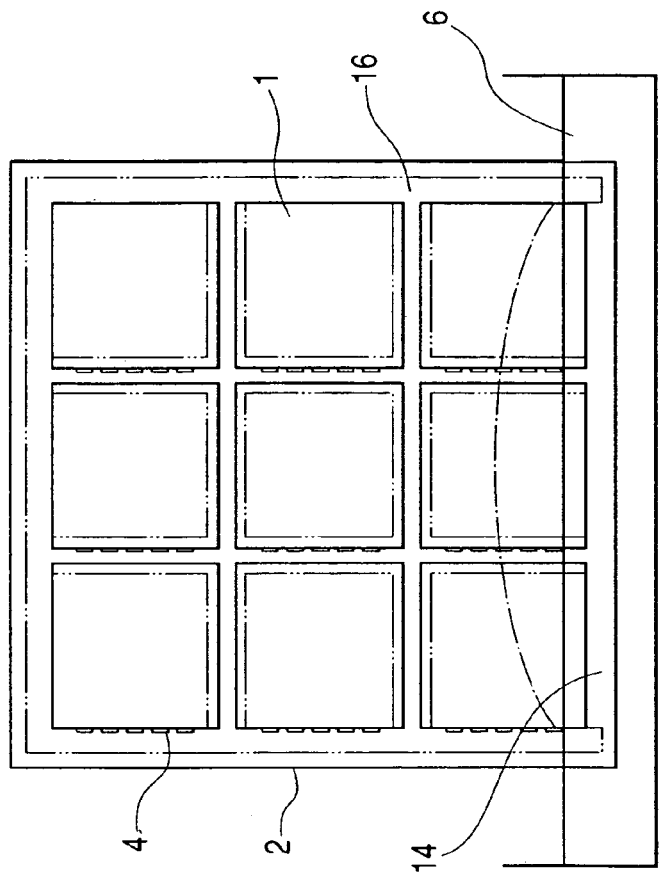
FIG. 10A
FIG. 10B

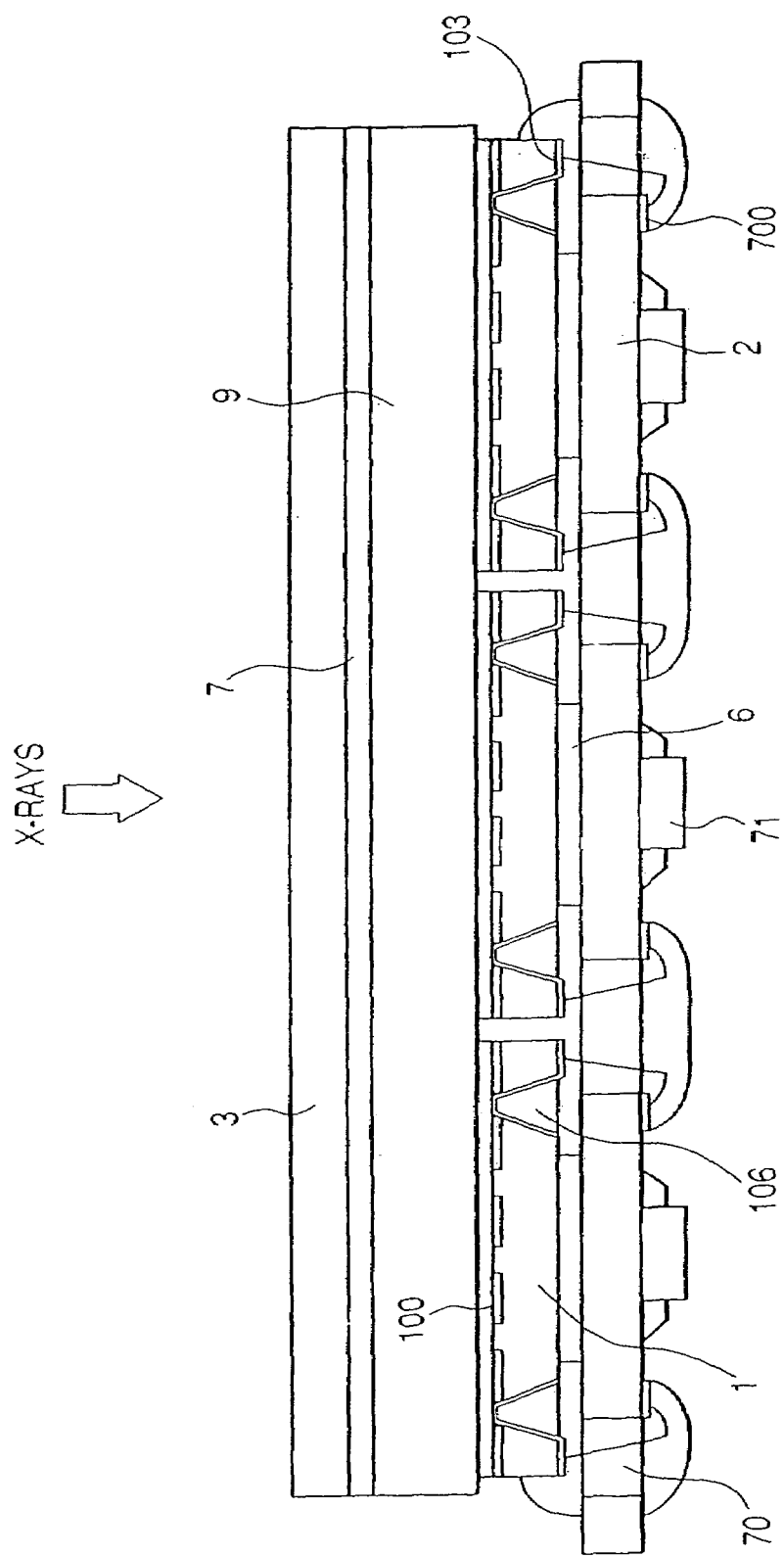

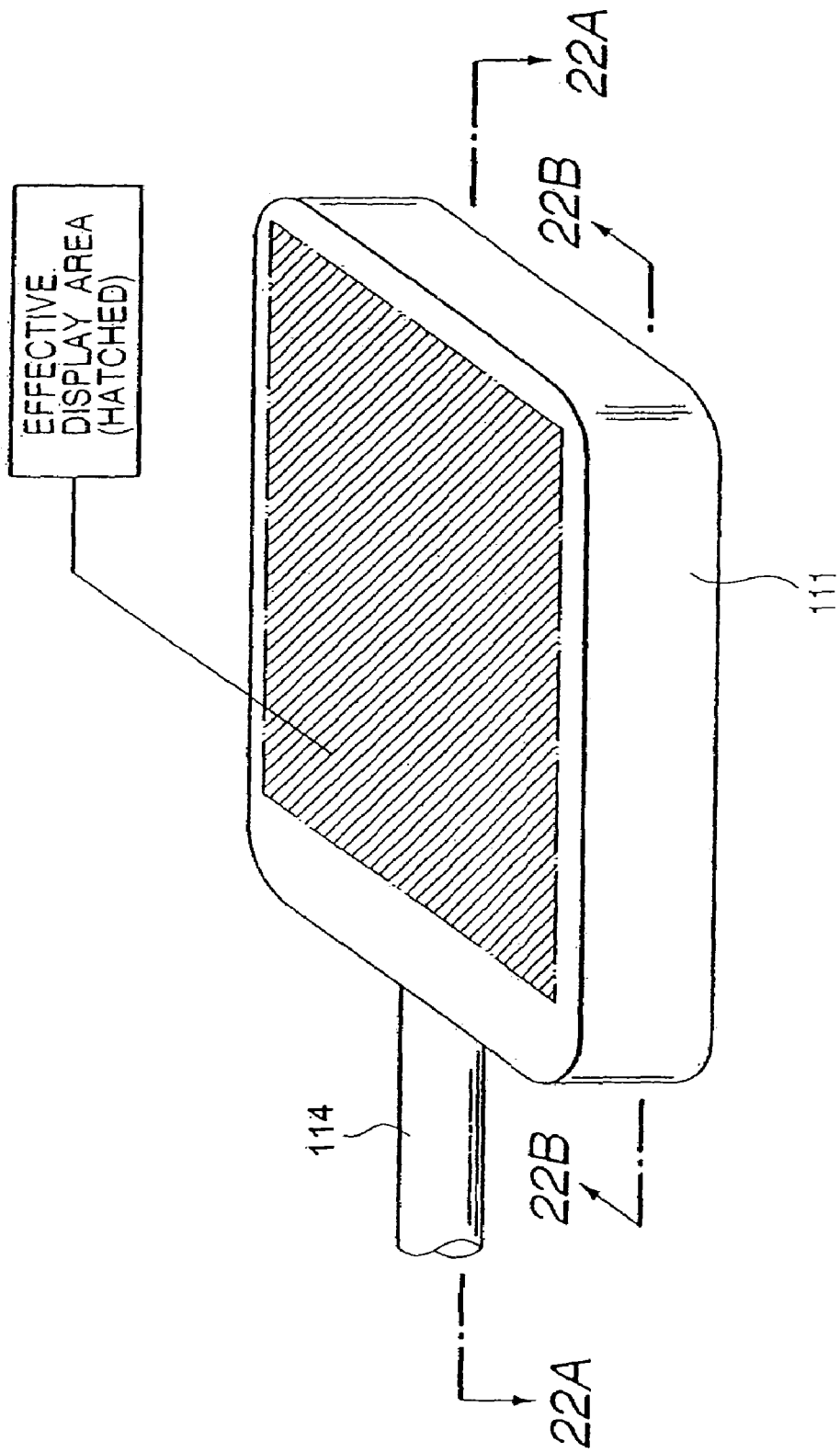

IMAGE PICKUP DEVICE, RADIATION IMAGE PICKUP DEVICE AND IMAGE PROCESSING SYSTEM

CROSS REFERENCE TO RELATED APPLICATION

This application is a division of application Ser. No. 09/900,035, filed Jul. 9, 2001 now U.S. Pat. No. 6,800,836, the entire content of which is hereby incorporated herein by reference.

BACKGROUND OF THE INVENTION

1. Field of the Invention

This invention relates to an image pickup device, a radiation image pickup device and an image processing system. More particularly, the present invention relates to a radiation image pickup device adapted to extend the image pickup area and an image processing system using such a radiation image pickup device. For the purpose of the invention, radiation refers to α rays, β rays, γ rays and so on and includes X-rays.

2. Related Background Art

A film screen system realized by combining intensifying screens and an X-ray film is popularly used for X-ray photography for the purpose of medical diagnosis. With such a system, the X-rays transmitted through an object to be photographed contain information on the inside of the object and are converted into rays of visible light showing intensities proportional to those of the transmitted X-rays by the intensifying screens. Then, the X-ray film is exposed to the rays of visible light.

In recent years, X-ray digital image pickup devices have been marketed. With such X-ray digital image pickup devices, X-rays are converted into rays of visible light with intensities proportional to those of the original X-rays by means of a scintillator and then the obtained rays of visible light are converted into an electric signal by means of a photoelectric converter, which electric signal is then transformed into a digital signal by means of an A/D converter.

More specifically, a known type of X-ray digital image pickup device comprises an ordinary image pickup device formed by arranging elements on a glass substrate, each element having an amorphous semiconductor sandwiched between a pair of electrodes, and a scintillator laid on the image pickup device in order to convert X-rays into rays of visible light. Another known type of X-ray digital image pickup device is realized by two-dimensionally linking modules, each comprising a tapered optical fiber formed by heating and softening a bundle of optical fibers and drawing the softened bundle, a photoelectric converter such as a CCD arranged at the tapered side of the optical fiber and a scintillator laid on the opposite side of the optical fiber.

X-ray digital image pickup devices of the above described types are mostly used for medical diagnosis and other applications. Such a device is required to show a high resolution, a low noise level, an ability of producing moving images and a wide imaging angle so that the doctor may be able to detect the diseased area quickly and make an accurate diagnosis.

However, while X-ray digital image pickup devices comprising amorphous semiconductors typically made of silicon and arranged on a glass substrate are adapted to show a large sensor effective area, they are accompanied by problems including that the size of pixels cannot be reduced because of the manufacturing process and the device characteristics and that the device sensitivity is limited. Therefore, devices of this type are not adapted to high speed operation particularly in terms of displaying moving images.

On the other hand, X-ray digital image pickup devices comprising photoelectric converters such as CCDs realized by using a silicon substrate have a problem that they cannot show a large sensor effective area mainly because of the restrictions in the manufacturing process and the high power consumption level that produces heat, although they are adapted to realize a small pixel size and pick up moving images because they are highly sensitive and can be driven at high speed.

There has been proposed a device comprising an increased number of elements, using optical fibers tapered in such a way that non-sensor areas of the photoelectric converters may not overlap in order to make it show an enlarged sensor effective area. FIG. 1 of the accompanying drawings is a schematic illustration of some of the photoelectric converters of such a device. In FIG. 1, there are shown substrates 1 carrying respective photoelectric converters, scintillators 3 for converting X-rays into rays of visible light showing a wavelength that can be detected by the photoelectric converters, a base member 7, tapered optical fibers 8, protection glass plates 9 and bonding wires 11. Reference numeral 12 in FIG. 1 denotes a ceramic package.

However, a tapered optical fiber is costly and the ratio of dimensional reduction is not stable because the tapering process involves dimensional dispersions. Furthermore, while several tapered optical fibers that are thick and heavy may be linked together, it is not realistic to link a large number of tapered optical fibers in order to produce a sensor effective area necessary for imaging the chest of a subject. Additionally, tapered optical fibers show a poor light transmission factor to a great disadvantage of the device.

FIG. 2 of the accompanying drawings is a schematic illustration of a conventional X-ray moving image system using an image intensifier (I—I). In FIG. 2, reference numeral 16 denotes the I—I. The X-rays striking the light entering surface are converted into electrons, which are multiplied to realize a high sensitivity of the system. The electrons are then converted to rays of light at the light exiting surface to show an image, which is then input to a CCD camera 15.

However, a system comprising such an image intensifier (I—I) inevitably shows large dimensions because it comprises a vacuum tube.

In the case of a CCD image pickup device, peripheral circuits and electrodes are required to be located in areas outside the display pixel area to inevitably make the peripheral marginal area surrounding the effective display area large as shown in FIG. 3A of the accompanying drawings. Additionally, the X-ray image sensor itself faces a limit for downsizing.

X-ray image sensors that are used for dental diagnosis are designed to be put into the mouth of the patient in order to pick up an image of the inside of the mouth. Then, however, it is impossible to take a picture of some of the molar teeth with such an X-ray image sensor. Particularly, it is highly difficult to put such an X-ray image sensor into the mouth of a child and, if such a sensor is forced into the mouth, it can induce a feeling of vomiting on the part of the patient to make the effort for taking a picture abortive.

As described above, it has been highly difficult to realize an X-ray digital image pickup device for medical diagnosis that is adapted to show a moving image with a high resolution if it is made to have a large sensor effective area and show reduced dimensions at low cost.

SUMMARY OF THE INVENTION

In view of the above identified circumstances, it is therefore the object of the present invention to provide a radiation image pickup device such as an X-ray image pickup device for medical diagnosis that is adapted to show a moving image with a high resolution and, at the same time, can be made to have a large sensor effective area and show reduced dimensions at low cost and also an image processing system using such a device. Such a radiation image pickup device minimizes the area that can not be imaged (to efficiently exploit the effective area) when taking an X-ray picture of the teeth of the patient and comprises a downsized X-ray image sensor that can also minimize the load of the patient when it is put into the mouth.

According to the invention, the above object is achieved by providing a radiation image pickup device having a plurality of photoelectric converters and a plurality of photoelectric converter substrates carrying respective terminals connected to the photoelectric converters on light receiving surfaces of the photoelectric converter substrates. The device further includes: (1) leads connected to the terminals and extending to a side opposite to the light receiving surfaces of the photoelectric converter substrates through gaps between the substrates; and (2) a wavelength converter for wavelength-converting radiation and a light guide section for guiding light from the wavelength converter to the plurality of photoelectric converters, the wavelength converter and the light guide section being provided with the plurality of photoelectric converter substrates.

In another aspect of the invention, there is provided an image pickup device having a plurality of photoelectric converter substrates, each carrying a plurality of photoelectric converters, said device comprising input/output terminals connected respectively to said photoelectric converters, said input/output terminals being arranged on surfaces of said photoelectric converter substrates different from the surfaces carrying said photoelectric converters.

In still another aspect of the invention, there is provided a radiation image pickup device comprising an image pickup device according to the invention and a wavelength converter arranged at the side of the light receiving surfaces of said photoelectric converter substrates of the image pickup device.

In still another aspect of the invention, there is provided an image processing system comprising an image pickup device according to the invention, image processing means for processing signals from the image pickup device for an image, a recording means for recording the signals from the image processing means, a display means for displaying signals from the image processing means and electric transmission means for transmitting signals from the image processing means.

BRIEF DESCRIPTION OF THE DRAWINGS

FIG. 10A is a schematic cross sectional lateral view of the embodiment of FIG. 4, showing a part thereof to illustrate how the light guide is bonded to the photoelectric converter substrates.

FIG. 10B is a schematic plan corresponding to FIG. 10A illustrating the adhesive filling step.

FIG. 20 is a schematic cross sectional lateral view of the embodiment of FIG. 16, showing a different manufacturing step.

FIG. 21 is a schematic perspective view of a fourth embodiment of image pickup device according to the invention.

DESCRIPTION OF THE PREFERRED EMBODIMENTS

Now, the present invention will be described in greater detail by referring to the accompanying drawings that illustrate preferred embodiments of the invention. While an image pickup device according to the invention can suitably be used for a radiation image pickup device, the present invention is by no means limited thereto.

(First Embodiment)

Figure 1:
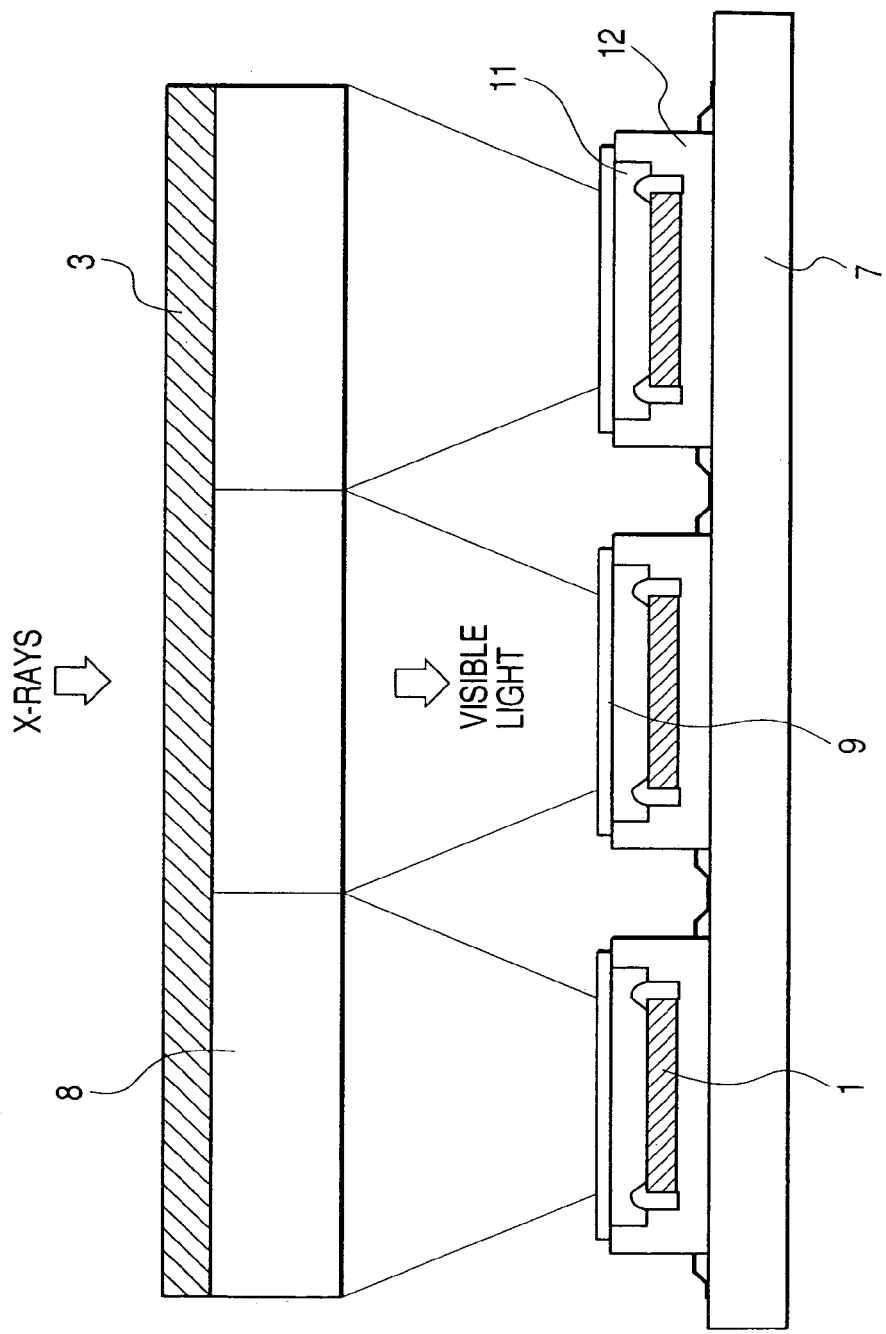
FIG. 1 is a schematic cross sectional lateral view of a known radiation image pickup device, showing a part thereof.
Figure 2:
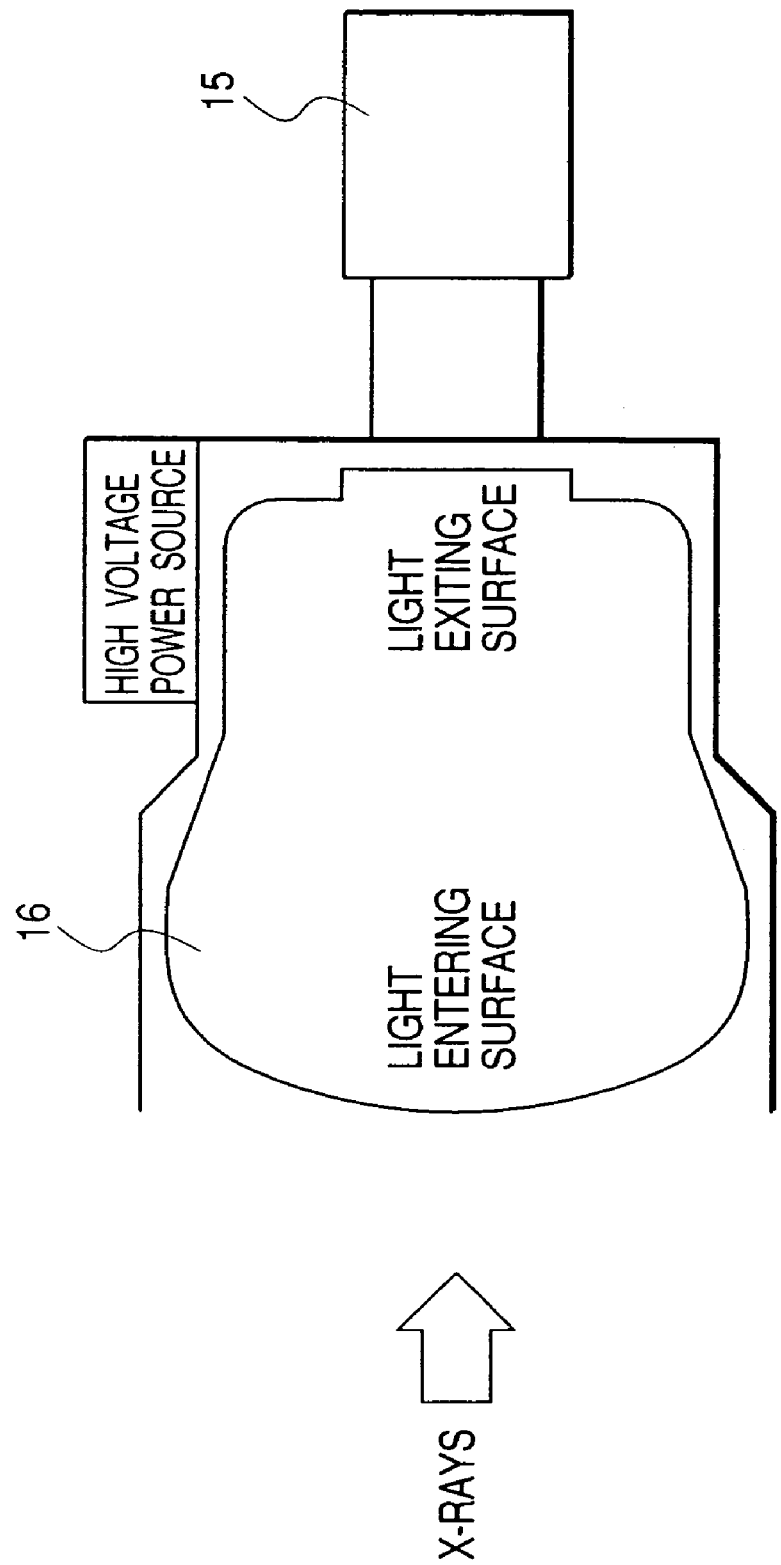
FIG. 2 is a schematic illustration of a known X-ray moving image system comprising an X-ray image intensifier (I—I).
Figure 3A:
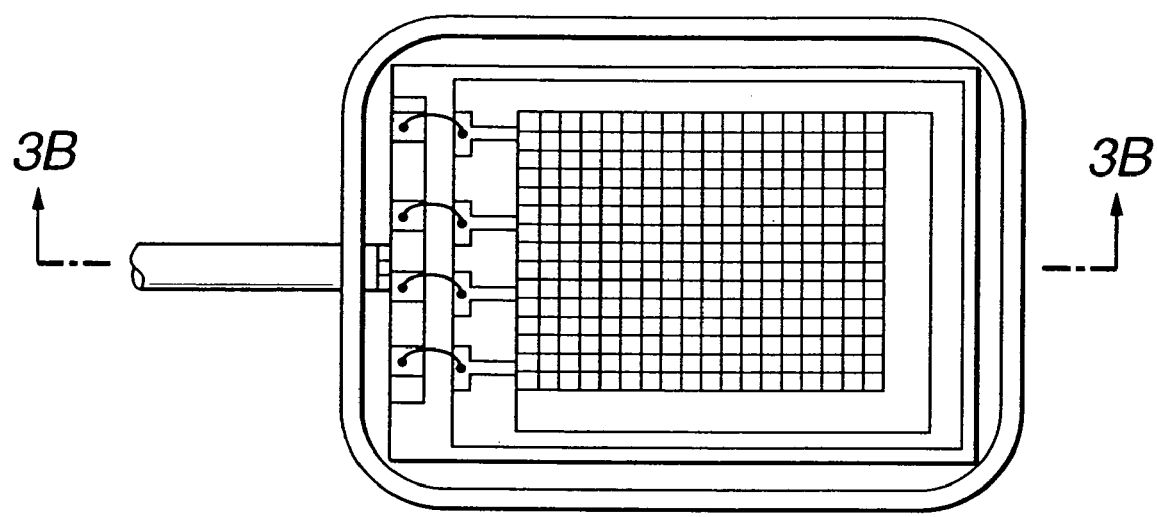
FIG. 3A is a schematic plan view of a known CCD image pickup device.
Figure 3B:
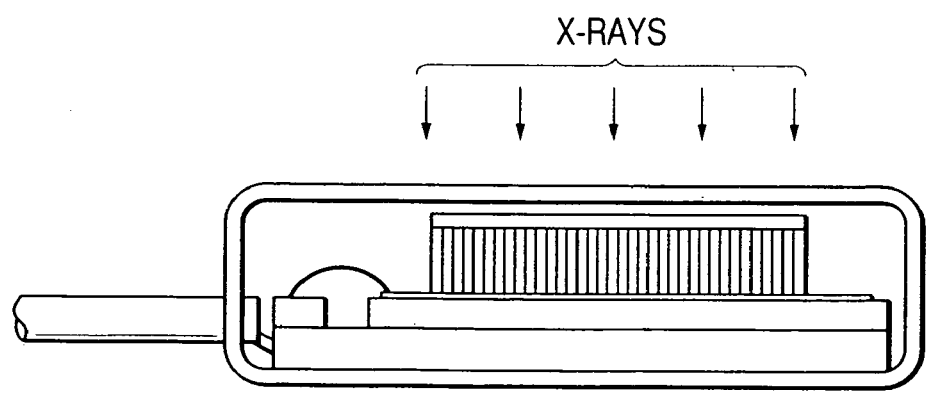
FIG. 3B is a schematic lateral view of the known CCD image pickup device of FIG. 3A.
Figure 4:
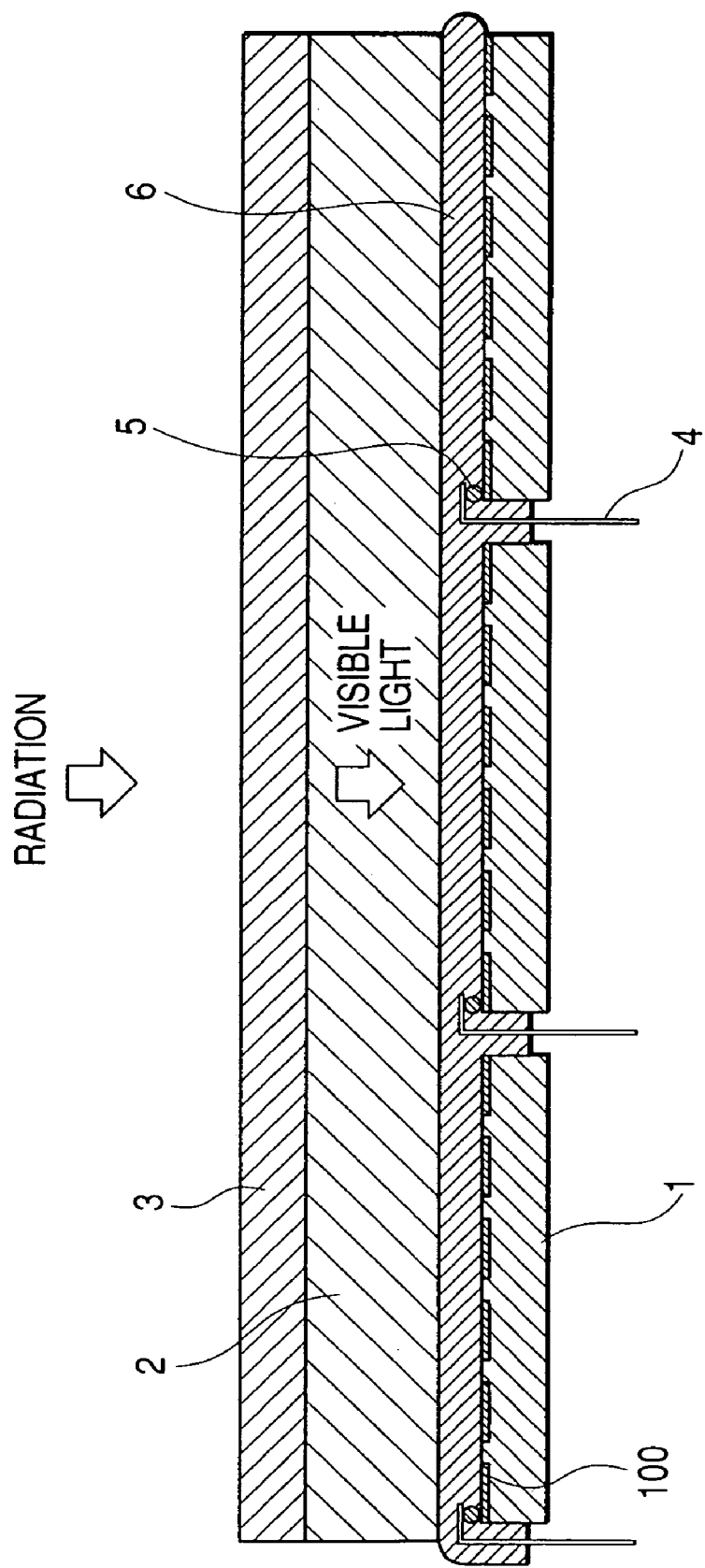
FIG. 4 is a schematic cross sectional lateral view of a first embodiment of image pickup device according to the invention, showing a part thereof.
Figure 5:
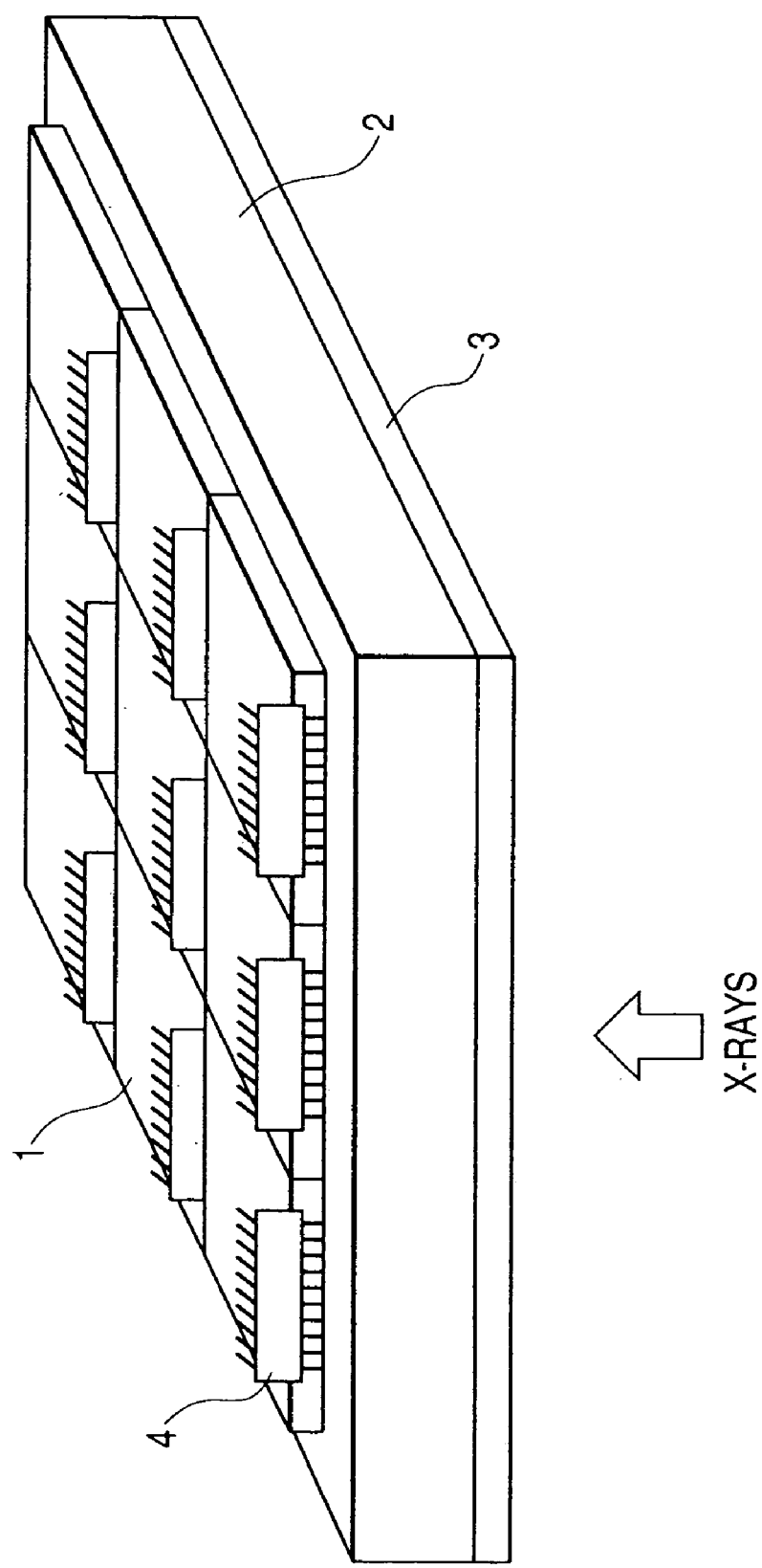
FIG. 5 is a schematic perspective view of the embodiment of image pickup device of FIG. 4.

FIG. 4 is a schematic cross sectional lateral view of the first embodiment of image pickup device according to the invention, showing a part thereof. FIG. 5 is a schematic perspective view of the embodiment and schematically illustrates the photoelectric converter substrates 1 of this embodiment.

Referring to FIGS. 4 and 5, the radiation irradiating an object produces information showing differences in the intensity thereof to reflect the state of the inside of the object. Then, the wavelength of the radiation is converted into one that can be detected by the photoelectric converters by the scintillator layer 3 operating as wavelength converter. The radiation is then made to pass through the light guide section 2 and the adhesive layer 6 before being detected by the photoelectric converter substrates 1 carrying a plurality of photoelectric converters 100 thereon. The detected information is then led to the rear side of the photoelectric converter substrates 1 from the input/output circuits arranged on the photoelectric converter substrates 1 by way of bumps 5 and leads extending through the bonded gaps of the photoelectric converter substrates 1.

The leads are bent at the respective edges of the photoelectric converter substrates 1 and extended to the side opposite to the one where the photoelectric converters 100 are arranged on the photoelectric converter substrates 1.

The photoelectric converter substrates 1 are arranged side by side and bonded to a common light guide section 2 by means of the adhesive 6. With this arrangement, it is not necessary to lay wires on the surfaces of the photoelectric converter substrates 1 to transfer the electric charges detected from the photoelectric converters 100 to a processing circuit so that the imaging effective area of the embodiment can be increased. In the case of a radiation detector, radiation may be transmitted through the scintillator 3, if slightly, and hence the wires extending to the rear side of the substrates of the embodiment serve for protection against radiation. The protection effect of this arrangement is particularly effective when the photoelectric converter substrates 1 are made of a material that blocks or absorbs radiation.

Figure 6:
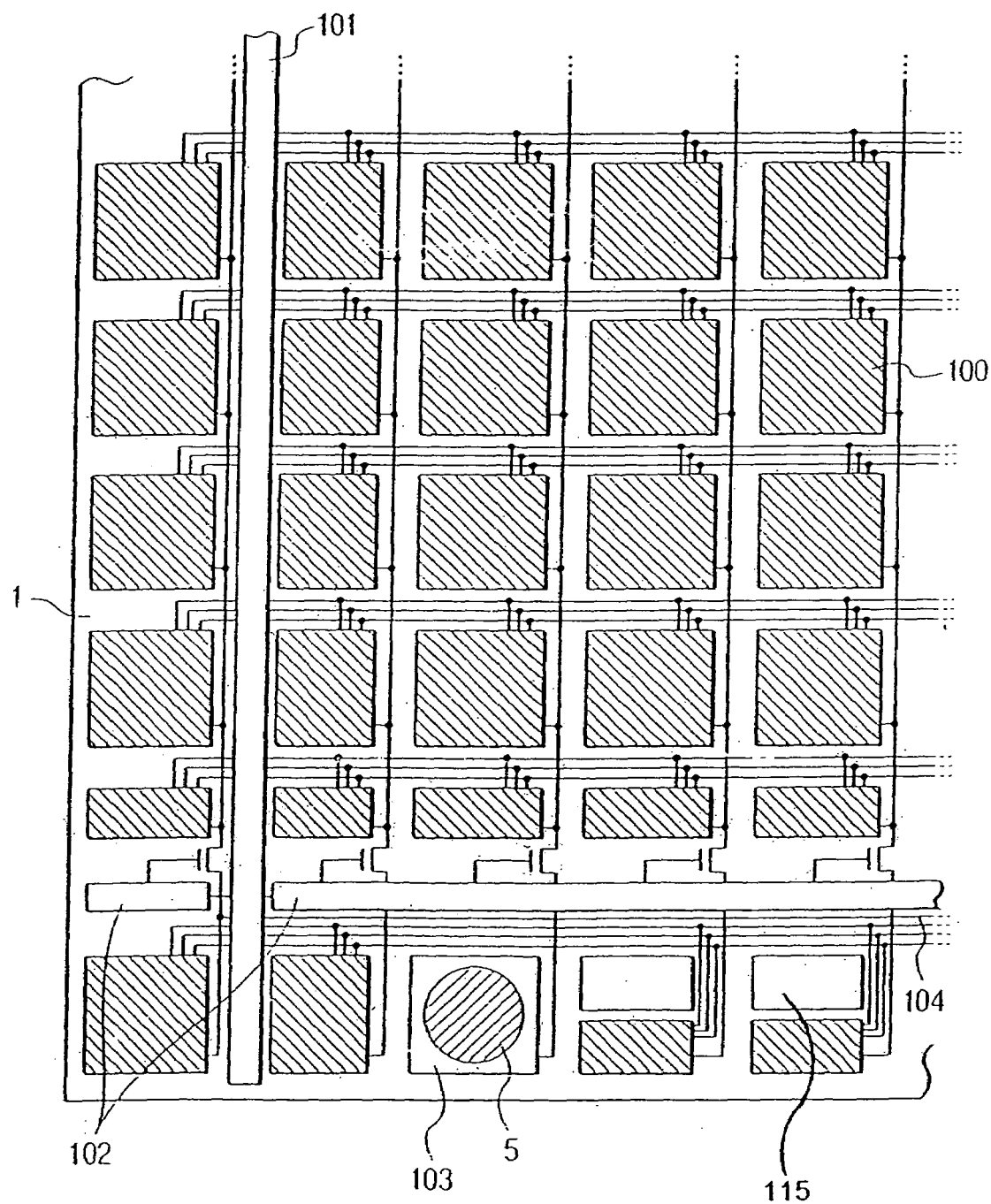
FIG. 6 is a schematic plan view of the embodiment of image pickup device of FIG. 4, showing a corner section thereof.

FIG. 5 is a schematic perspective view of this embodiment of image pickup device. Referring to FIG. 5, the photoelectric converter substrates 1 are arranged two-dimensionally in three rows and three columns and leads and flexible circuit substrates 4 are extending from the bonded gaps of the photoelectric converter substrates 1 to the rear side relative to the light guide section 2. FIG. 6 is a schematic plan view of this embodiment of image pickup device, showing a corner section of one of the photoelectric converter substrates 1 made of silicon. Referring to FIG. 6, the photoelectric converter substrate 1 carries thereon two-dimensionally arranged light receiving pixels (photoelectric converters) 100, external input/output terminals 103, a vertical drive circuit for sequentially driving the two-dimensionally arranged pixels 100, a column scanning circuit 102 and wires 104 connecting the circuits, the pixels and the electrode terminals. CMOSs may advantageously be used for the photoelectric converters.

The light receiving pixels 100 are arranged substantially over the entire surface of the photoelectric converter substrate 1 at a pitch of 100 μm. The input/output terminals 103 are arranged in a distributed manner at regular intervals along an edge of the photoelectric converter substrate 1. Protection circuits 115 are arranged between the input/output terminals of the photoelectric converters 100 and the processing circuit to protect the circuits against electrostatic destruction and other damages.

While each of the light receiving pixels 100 arranged along the drive circuit 102 and the input/output terminals 103 that are distributed and also along the edges of the light receiving pixels 100 has a light receiving area smaller than any of the remaining light receiving pixels and hence may receive light at a lower rate if compared with the latter, its output may be corrected to make it balanced with the output of any other light receiving pixel.

Figure 7A:
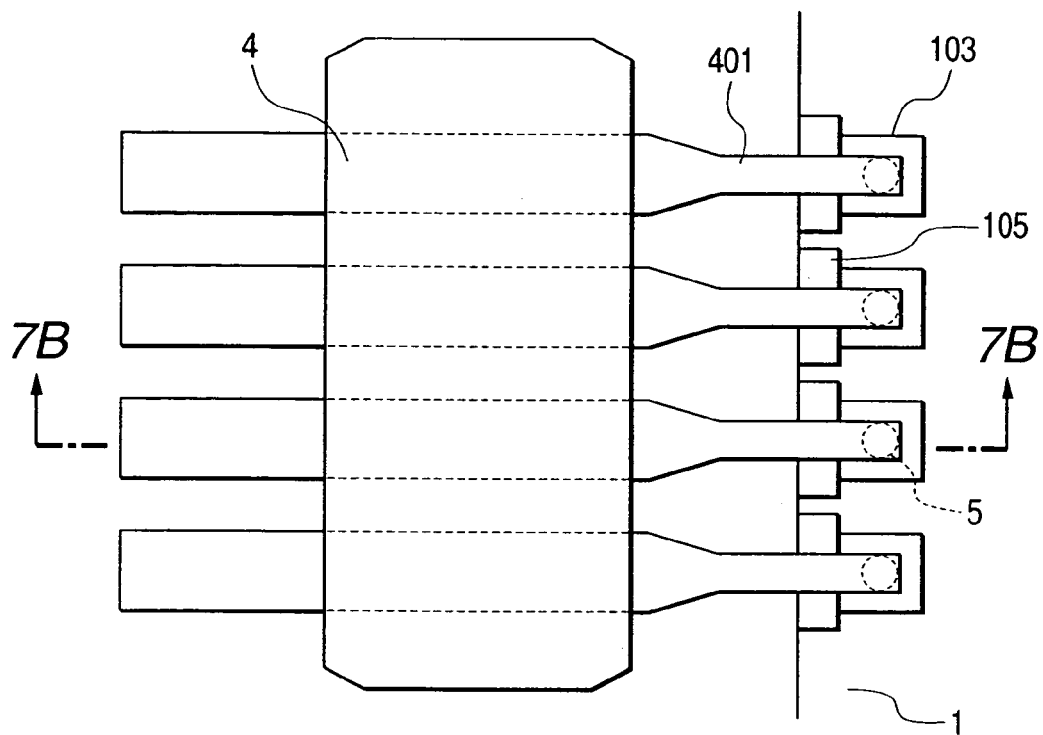
FIG. 7A is an enlarged schematic plan view of the embodiment of image pickup device of FIG. 4, showing a part thereof where some of the input/output terminals are bonded to one of the flexible wiring substrate 4.
Figure 7B:
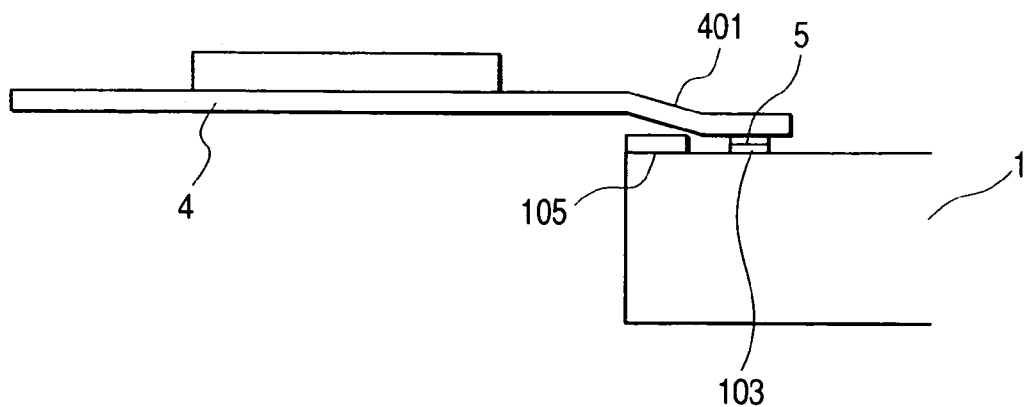
FIG. 7B is an enlarged schematic lateral view corresponding to FIG. 7A.

FIGS. 7A and 7B schematically illustrate a part of the embodiment where the leads 401 of a flexible wiring substrate 4 are bonded to the respective input/output terminals 103 arranged on the surface of a photoelectric converter substrate 1 that carries photoelectric converters 100. FIG. 7A is a schematic plan view of the part, whereas FIG. 7B is a schematic cross sectional view thereof.

Referring to FIGS. 7A and 7B, firstly bumps 5 are formed on the respective input/output terminals 103 arranged on the photoelectric converter substrate 1. The bumps 5 may be of the so-called stud bump type or formed by plating. The leads 401 of the flexible wiring substrates 4 are formed by etching copper foil and plated with nickel or gold.

Each of the bumps 5 on the input/output terminals 103 is connected to a corresponding lead 401 of a flexible wiring substrate 4 typically by a metal bonding method using ultrasonic waves. Then, the bonded lead 401 of the flexible wiring substrate 4 is bent at the corresponding edge of the photoelectric converter substrate 1.

Figure 8:
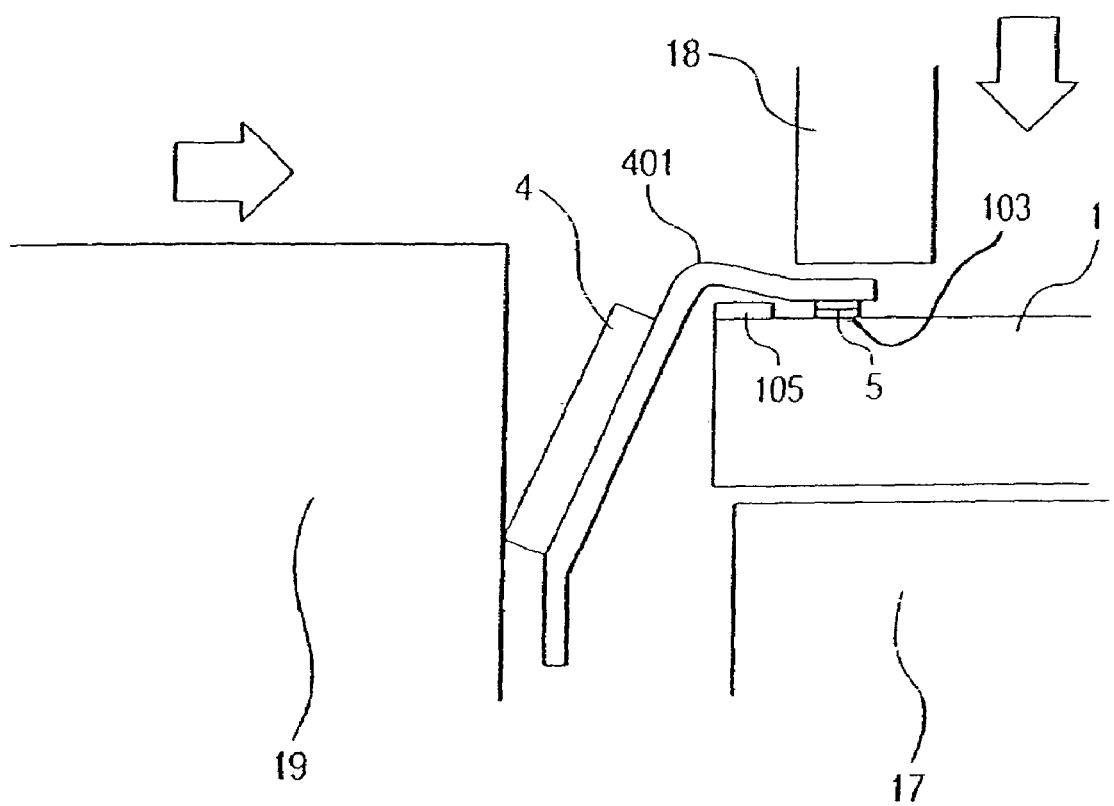
FIG. 8 is a schematic illustration of the process of bending a lead 401 and extending it to the rear side of one of the photoelectric converter substrates 1.

FIG. 8 is a schematic illustration of the process of bending a lead 401 and extending it to the rear side of the photoelectric converter substrate 1. The photoelectric converter substrate 1 connecting the lead 401 of the flexible wiring substrate 4 to the related light receiving pixels 100 by way of the bump 5 is rigidly held to a table 17 typically by means of vacuum suction and its input/output terminal bonding section is lightly held by a holder member 18. Then, jig 19 is moved horizontally to bend the lead by about 90 degrees.

In this embodiment, an organic insulating layer 105 (polyimide resin layer) is formed on an area extending from the input/output terminal 103 to the edge of the photoelectric converter substrate 1 in order to prevent any electric short circuiting that can occur as the edge of the photoelectric converter substrate 1 contacts the lead 401 and/or any mechanical damage of the edge of the photoelectric converter substrate 1 due to mechanical force from taking place when the lead 401 is bent. Any possible short circuiting between the corresponding lateral side of the photoelectric converter substrate 1 and the lead 401 can be prevented by arranging an insulating layer (polyimide layer) on the rear surface of the flexible wiring substrate 4. The polyimide layer has a thickness of 25 μm and covered by an about 18 μm thick copper foil wiring layer formed by plating. Thus, the flexible wiring substrate 4 shows a total thickness of about 43 μm without any adhesive applied thereto.

Then, as shown in FIGS. 4 and 5, the plurality of photoelectric converter substrates 1 connected to the flexible wiring substrates 4 carrying the bent leads 401 are bonded to the light guide section 2 by means of a transparent adhesive agent 6.

Figure 9:
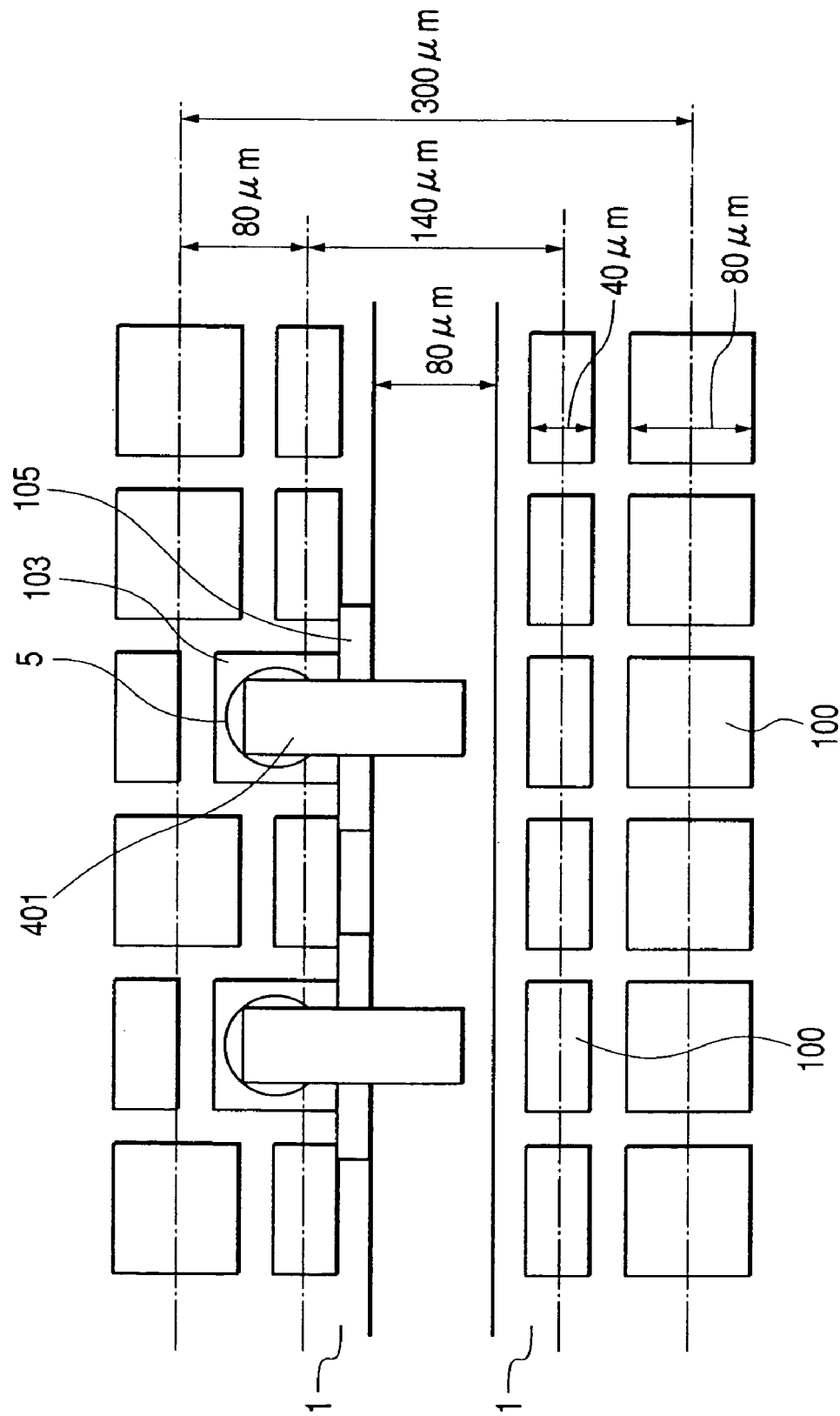
FIG. 9 is an enlarged schematic plan view of the embodiment of FIG. 4, showing a part thereof to illustrate the arrangement of pixels between photoelectric converter substrates.

FIG. 9 is an enlarged schematic plan view of the embodiment, showing a part thereof to illustrate the arrangement of pixels between a pair of photoelectric converter substrates. If the pixels are arranged at a pitch of 100 μm, any two adjacently located photoelectric converter substrates are arranged with a gap of 80 μm separating them, taking the thickness of each flexible wiring substrate 4 and the bonding accuracy into consideration. Therefore, while the pixels there show irregular pitches of 100-80-140-80-100 as shown in FIG. 9, the defect of the irregularity is not visually remarkable and the quality of the produced image is not particularly bad if compared with an arrangement that is devoid of an entire row of pixels there.

The adhesive 6 preferably transmits light very well and shows an excellent elasticity.

FIG. 10A is a schematic cross sectional lateral view of the embodiment, showing a part thereof to illustrate how the light guide section 2 is bonded to the photoelectric converter substrates 1. After applying adhesive 15 at the four corners of each of the photoelectric converter substrates 1 for temporary bonding, the photoelectric converter substrate 1 is aligned with the predetermined position of the light guide section 2 and then the adhesive 15 for temporary bonding is hardened. After bonding and aligning all the photoelectric converter substrates 1 in this way, the gaps separating the photoelectric converter substrates and the gaps between the edges of the photoelectric converter substrates 1 arranged along the outer periphery and the corresponding edges of the light guide section 2 are sealed by a means of a high viscosity adhesive 16.

However, one of the peripheral edges is not sealed and an opening 14 is left there. Thereafter, the gap between the light guide section 2 and the corresponding photoelectric converter substrates 1 at the opening 14 is put into a vacuum condition in a vacuum chamber and the opening 14 is brought into contact with a boat containing adhesive 6 therein as illustrated in FIG. 10B. Then, the vacuum condition is eliminated to make the atmospheric pressure prevail there once again. As a result of the pressure difference, the adhesive 6 is drawn in to fill the gap. The adhesive 6 and the adhesive 15 (shown in FIG. 10A) for temporary bonding are preferably made of a same material or different materials whose refractive indexes are same or equivalent. With this process of providing a predetermined gap between the photoelectric converter substrates 1 and the light guide section 2 in advance by means of an adhesive 15 (shown in FIG. 10A) for temporary bonding and subsequently bonding the photoelectric converter substrates 1 and the light guide section 2, the plurality of photoelectric converter substrates can be aligned highly accurately.

Figure 11:
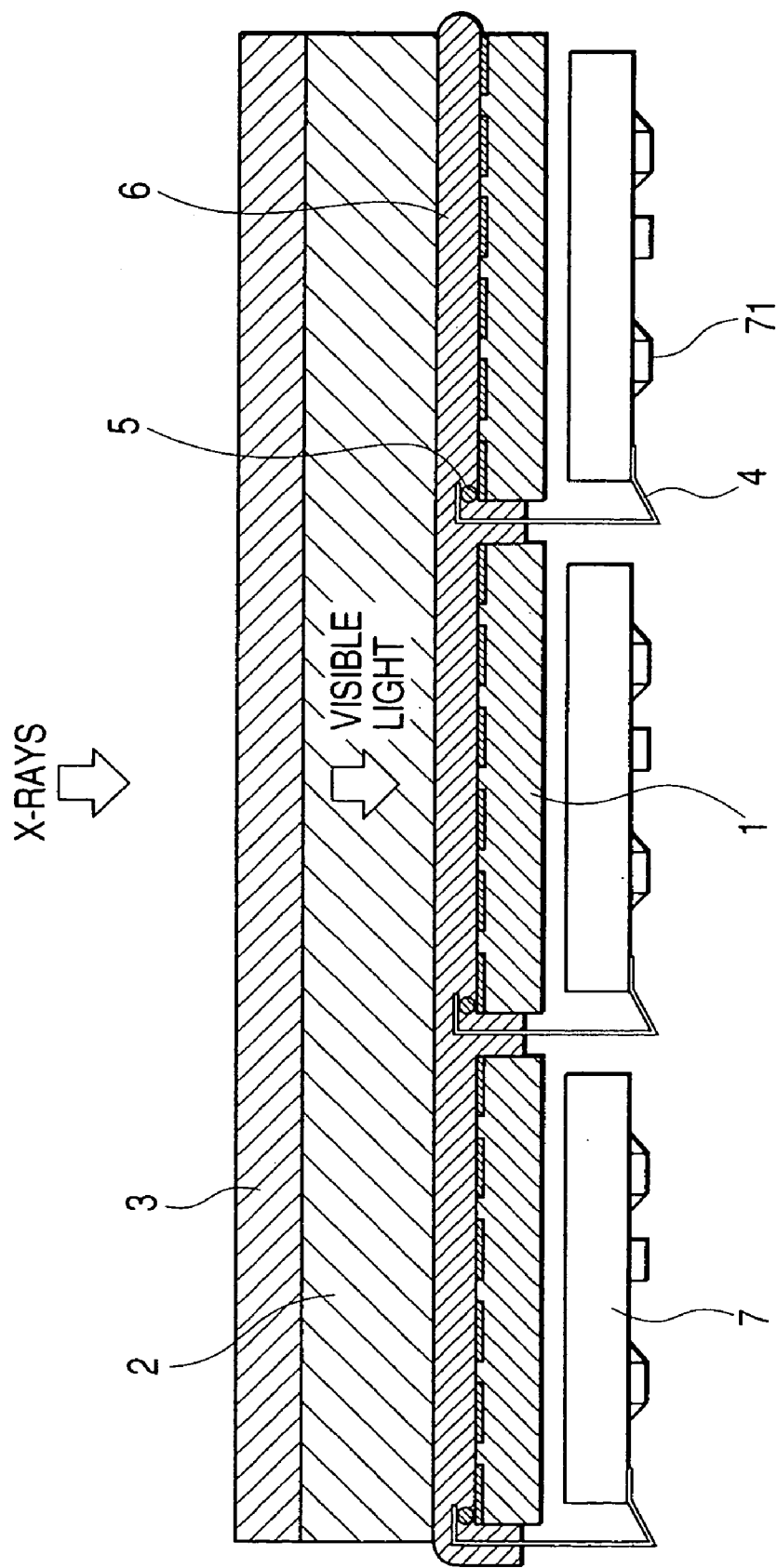
FIG. 11 is a schematic cross sectional lateral view of the embodiment of FIG. 4, illustrating a different manufacturing step thereof.

Subsequently, the filling adhesive 6 is caused to harden and each of the flexible wiring substrates 4 extending from the photoelectric converters is connected to related electronic parts 71 including the processing circuit on the corresponding base member 7 as shown in FIG. 11. While this embodiment comprises additional base members 7, the processing circuits and other parts may be formed directly on the rear surfaces of the photoelectric converter substrates 1 to further reduce the height of the embodiment by selecting an appropriate material for the photoelectric converter substrates 1.

The light guide section 2 may preferably be formed by using an optical fiber plate that is formed by cutting a large bundle of optical fibers to make it show a plate-like profile. An optical fiber plate can be prepared through a process that is by far simpler than the process for preparing a tapered bundle of optical fibers. While an optical fiber plate is preferably used for the light guide section in order to guide light to the photoelectric converters without scattering it, a light transmitting substrate such as a glass substrate may alternatively be used for the light guide section when scattering of light is permissible or expected to take place only scarcely.

When the embodiment is used as radiation image pickup device, the use of a light guide member that is transparent relative to visible light but opaque relative to radiation between the scintillator for changing the wavelength of radiation and the photoelectric converters can effectively prevent any degradation and operation errors that can occur when the photoelectric converters are exposed to radiation from taking place. When the light guide member is made of a material containing lead, the X-rays that are not converted to rays of visible light by the scintillator may be effectively blocked by the lead contained in the light guide member to consequently minimize the adverse effect of X-rays on the photoelectric converters and produce X-ray images with little noise. While the embodiment is made to comprise a light guide member, it may not necessarily comprise such a member. The scintillator 3 may be made of gadolinium sulfide (GdS) or cesium iodide (CsI). An image pickup device that does not comprise a scintillator 3 may be used as a photodetector for detecting rays of the visible light band.

(Second Embodiment)

Figure 12:
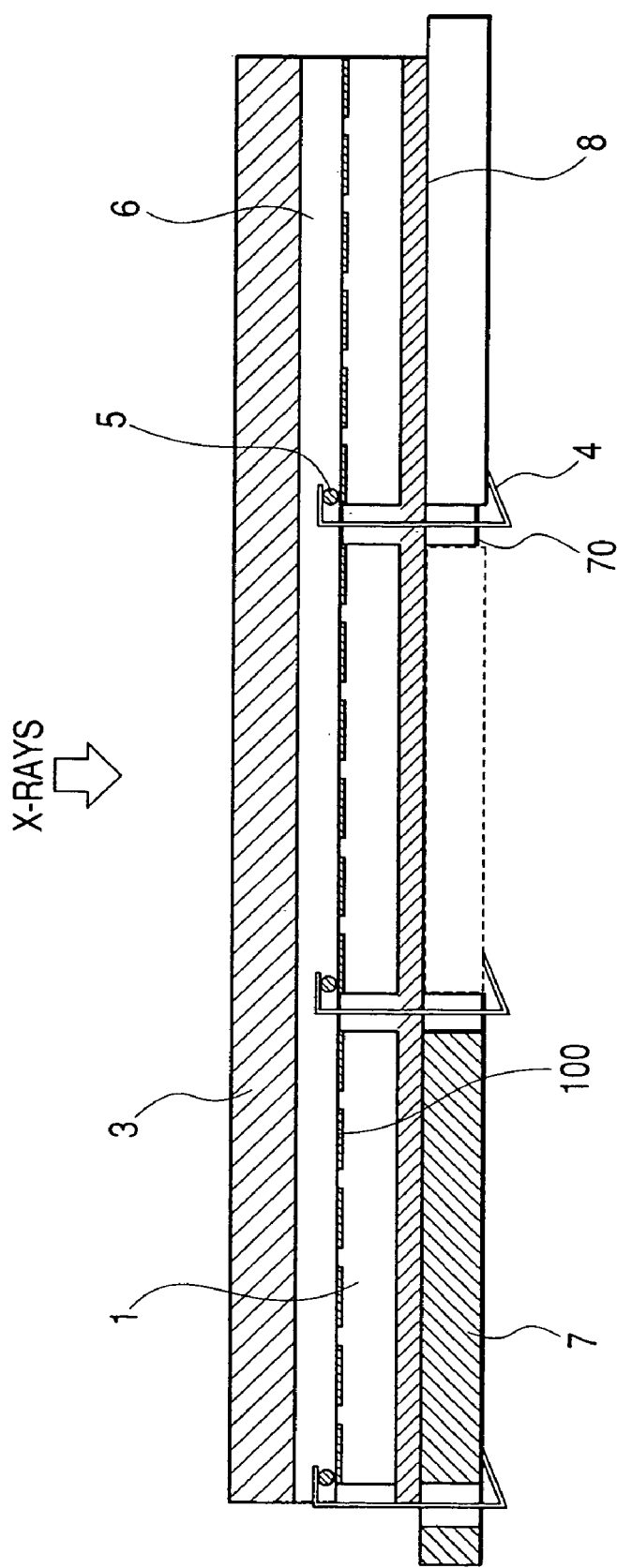
FIG. 12 is a schematic cross sectional lateral view of a second embodiment of image pickup device according to the invention.

FIG. 12 is a schematic cross sectional lateral view of a second embodiment of image pickup device according to the invention. In FIG. 12, the components that are same as or similar to those of the first embodiment are denoted respectively by the same reference symbols and will not be described any further. This embodiment differs from the first embodiment in that the base member of this embodiment is provided with slits and bonded to the corresponding photoelectric converter substrates 1 by means of adhesive 8.

Each of the leads connected to the respective input/output terminals 103 of the photoelectric converters 100 arranged on the photoelectric converter substrates 1 by way of the bumps 5 is bent at the corresponding edge of the related photoelectric converter substrate 1 and extended to the rear surface side of the photoelectric converter substrate 1. Then, the photosensitive converter substrate 1 carrying a plurality of photoelectric converters 100 thereon is bonded to the base member 7 by means of adhesive 8. The base member 7 is provided with slits 70 for allowing the leads and the flexible circuit substrates 4 connected to the leads to pass therethrough and get to the rear side of the base member 7.

The radiation irradiating the object produces information showing differences in the intensity thereof to reflect the state of the inside of the object. Then, the information is expressed in terms of differences in the intensity of rays of visible light by the scintillator 3 and then in terms of differences in the intensity of an electric signal at the photoelectric converter substrates 1. The electric signal is then subjected to A/D conversion by a processing circuit (not shown) arranged at the base member 7 and the original image is restored by the image processing system that processes the signal produced as a result of the A/D conversion.

Figure 13:
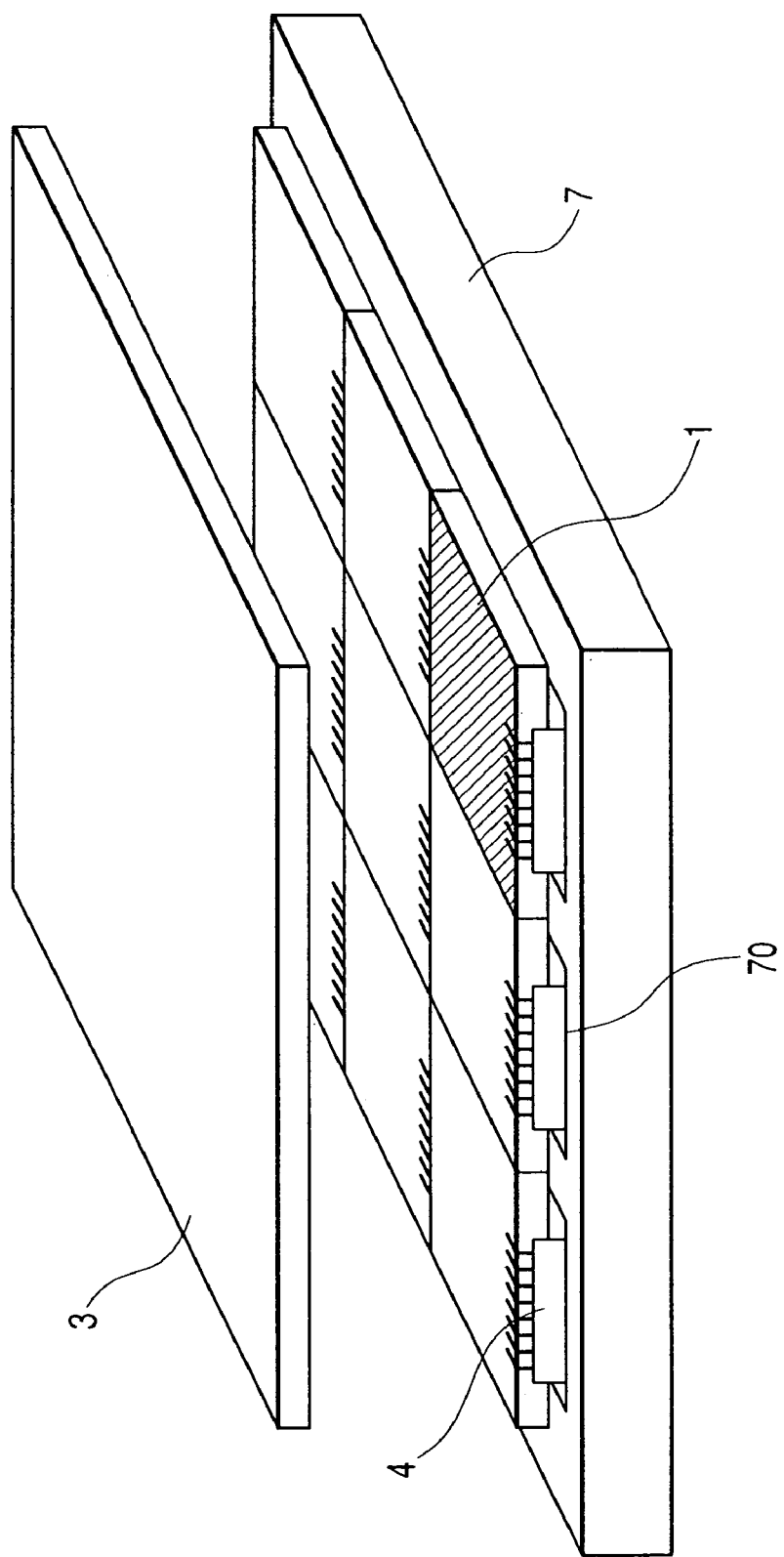
FIG. 13 is an exploded schematic perspective view of the embodiment of FIG. 12.

FIG. 13 is an exploded schematic perspective view of the second embodiment, which is a radiation image pickup device. A plurality of photoelectric converter substrates 1 are arranged two-dimensionally on the base member 7 provided with slits 70 and a scintillator 3 is arranged thereon.

Figure 14A:
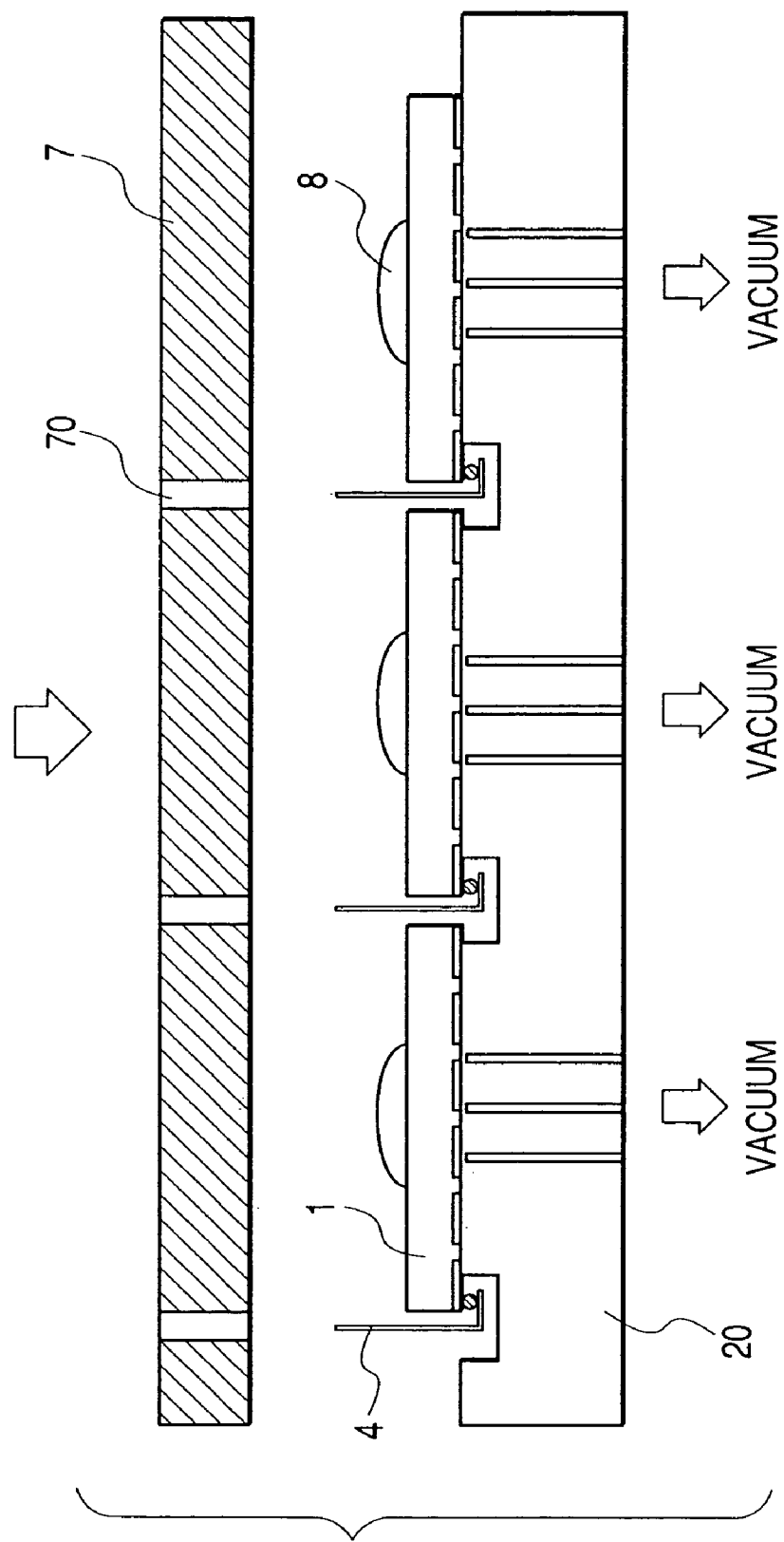
FIG. 14A is a schematic cross sectional lateral view of the embodiment of FIG. 12, illustrating a different manufacturing step thereof.

FIG. 14A is a schematic cross sectional lateral view of this embodiment, illustrating a manufacturing step where the photoelectric converter substrates 1 are bonded to the base member 7. The photoelectric converter substrates 1 are aligned on a securing stage 20 for rigidly securing the photoelectric converter substrates 1 and subsequently sucked and secured to the stage by way of vacuum holes arranged therein. The photoelectric converter substrates 1 can be aligned properly by using transparent members arranged in necessary areas of the stage 20 and using alignment marks formed respectively in the photoelectric converters.

Figure 14B:
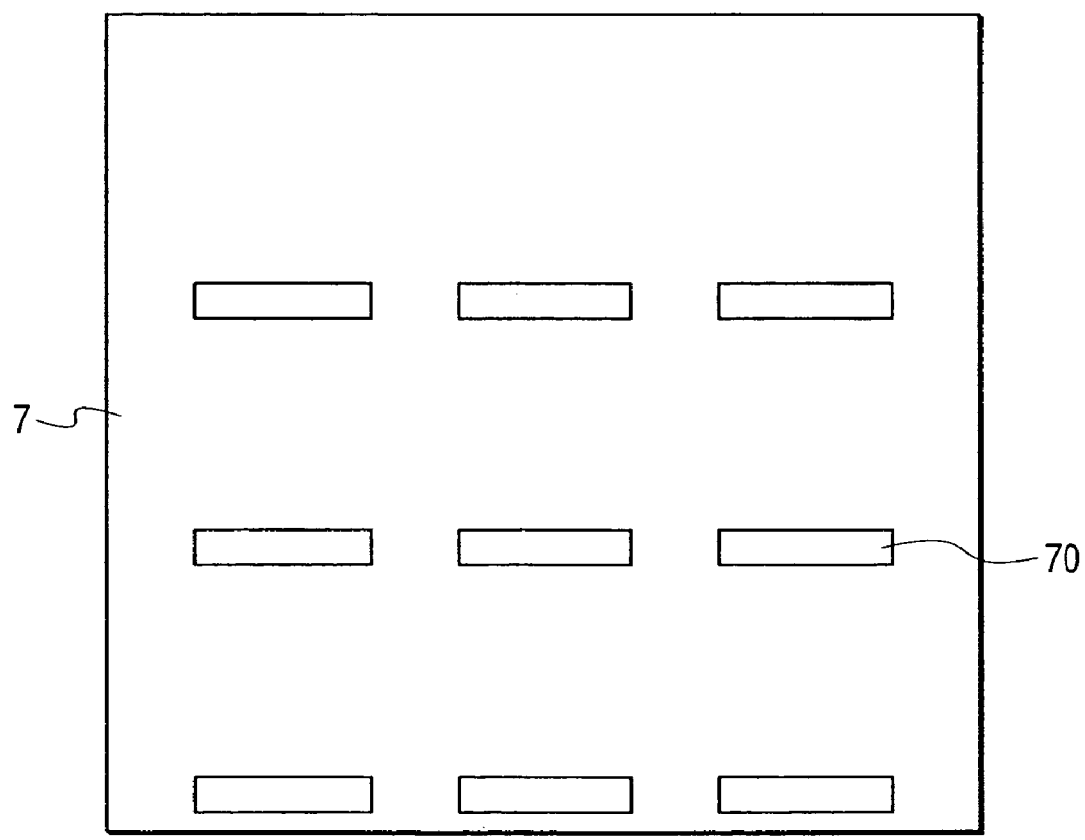
FIG. 14B is a schematic plan view of the base member of the embodiment of FIG. 12.

Then, a necessary amount of adhesive 8 is applied to the rear surface of each of the photoelectric converter substrates 1 and the adhesive is caused to harden, while pressing the base member 7 provided with slits 70 against the photoelectric converter substrates 1. More specifically, silicone resin of a wet-hardening type may be used for the adhesive 8. The adhesive 8 is not required to transmit light because it is applied to the rear surfaces of the light receiving elements of the embodiment. FIG. 14B is a schematic plan view of the base member of this embodiment. As seen from FIG. 14B, the base member 7 is provided with a plurality of slits 70 that are arranged to correspond to the flexible circuit substrates 4 extending respectively from the related edges of the photoelectric converter substrates 1.

Figure 15:
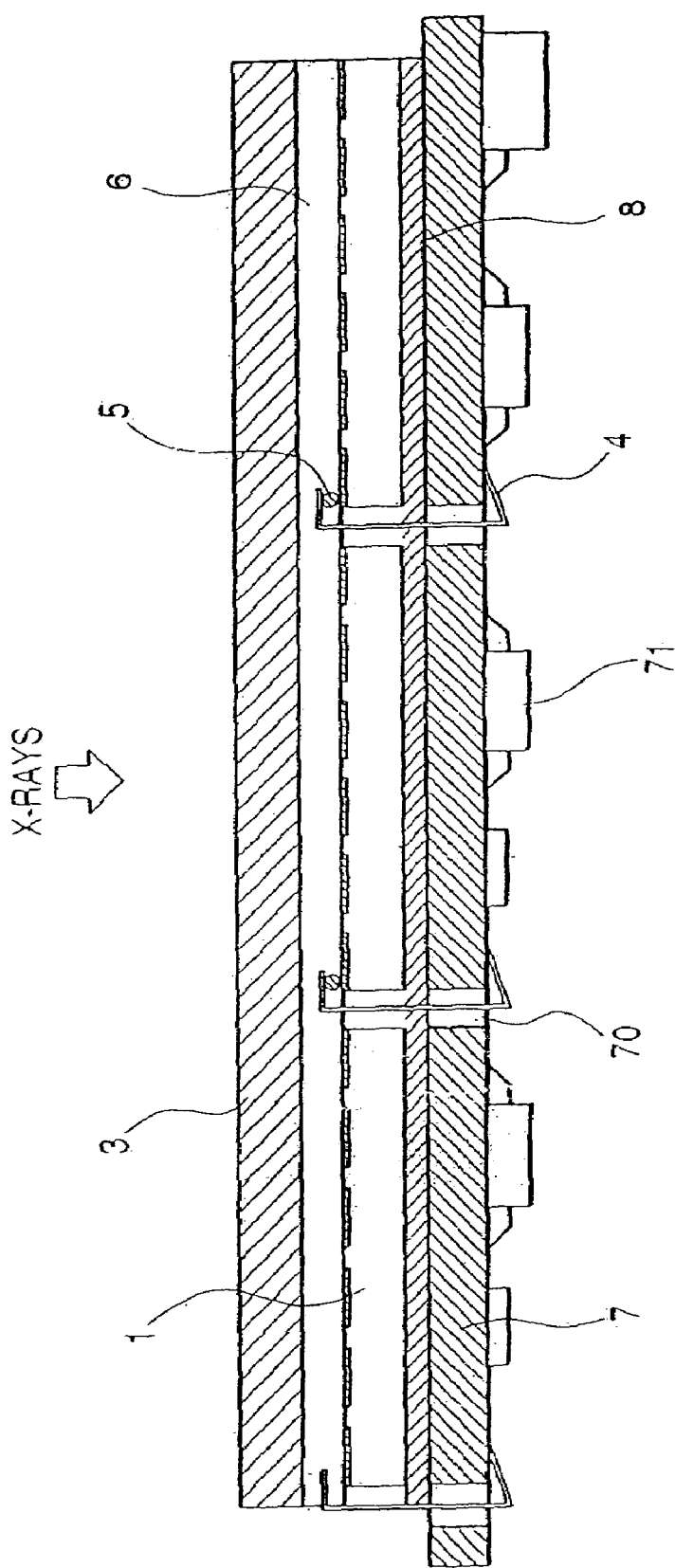
FIG. 15 is a schematic cross sectional lateral view of the embodiment of FIG. 12, illustrating a further different manufacturing step thereof.

Then, as shown in FIG. 15, each of the flexible wiring substrates 4 extending through the slits 70 is connected to related electronic parts 71 including the processing circuits provided on the rear surface of the base member 7.

A printed wiring substrate typically made of glass epoxy may be used for the base member 7. Alternatively, a ceramic substrate or a glass substrate may be used for the base member 7. The substrate may contain a substance such as Pb that can effectively block radiation and protect the electronic parts 71 from the radiation, if slight, that has been transmitted through the scintillator 3. Since the base member 7 needs to be provided with slits 70 as shown in FIG. 14B, it is preferably such that the slits can be formed therethrough with ease. Preferably it is lightweight and can mount electronic parts without difficulty. Therefore, it is preferably made of glass or ceramic in order to meet those requirements. As in the first embodiment, a light guide section may be arranged on the photoelectric converter substrates 1 of this embodiment.

(Third Embodiment)

Figure 16:
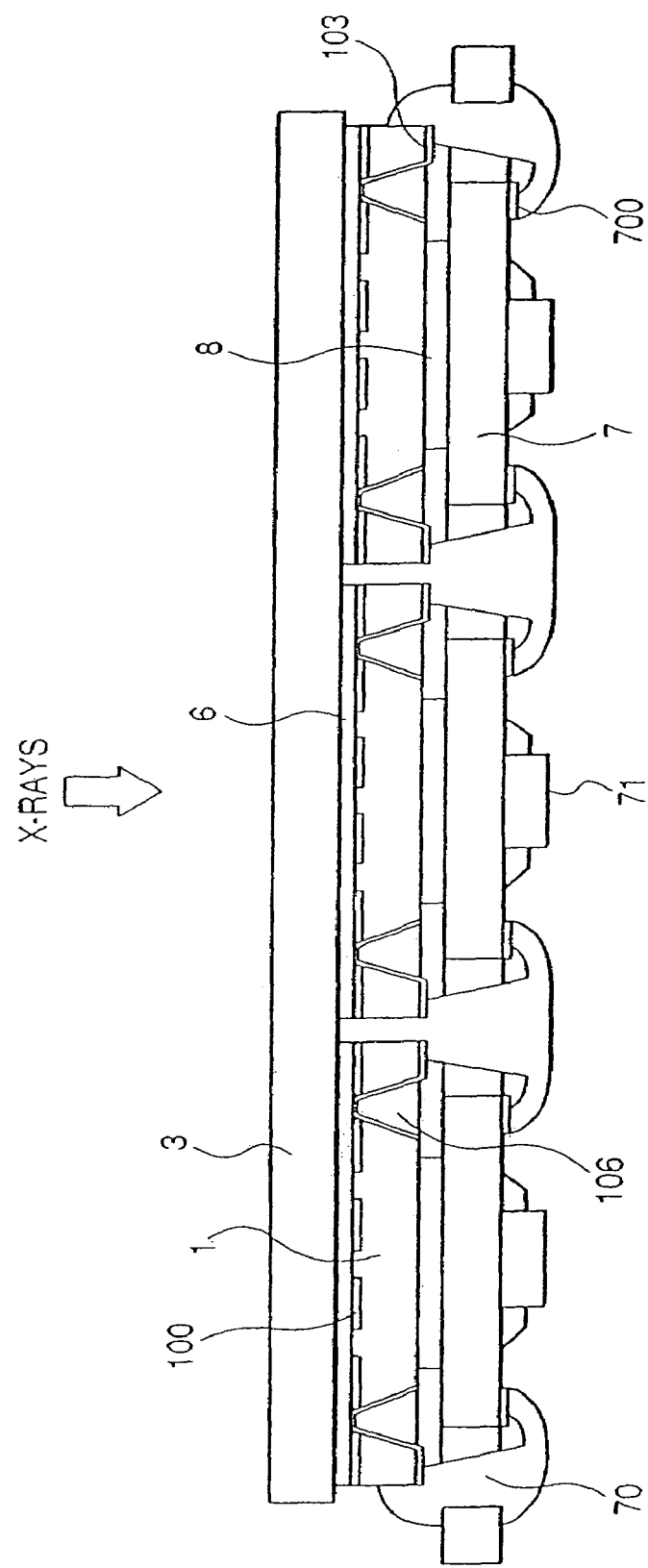
FIG. 16 is a schematic cross sectional lateral view of a third embodiment of image pickup device according to the invention.
Figure 17:
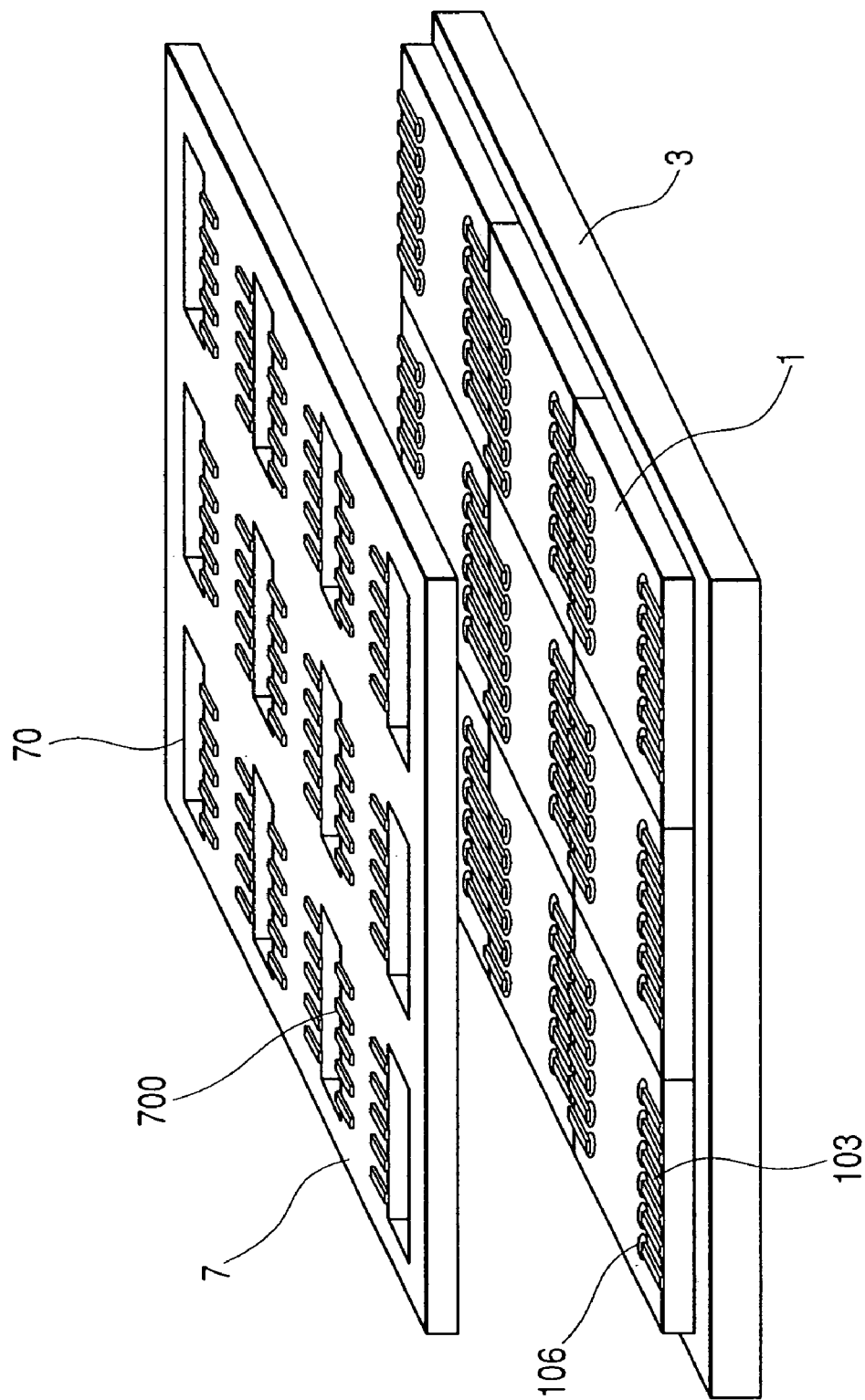
FIG. 17 is an exploded schematic perspective view of the embodiment of FIG. 16.

FIG. 16 is a schematic cross sectional lateral view of a third embodiment of image pickup device according to the invention and FIG. 17 is an exploded schematic perspective view of the embodiment. In FIGS. 16 and 17, the components that are same as or similar to those of the first and second embodiments are denoted respectively by the same reference symbols and will not be described any further.

In this embodiment, the input/output terminals 103 of the photoelectric converter substrates 1 are arranged on surfaces different from the light receiving surfaces of the photoelectric converters 100 in order to further reduce the non-light receiving areas of the light receiving surfaces. With this arrangement, almost all the surfaces of the photoelectric converter substrates 1 operate as light receiving surfaces at a side thereof. Therefore, as a plurality of photoelectric converter substrates are arranged side by side, the light receiving pixels formed on the photoelectric converter substrates 1 are smoothly arranged without any particularly large gaps to increase the effective area of the embodiment.

FIG. 17 is an exploded schematic perspective view of the image pickup device of FIG. 16. As shown in FIG. 17, a plurality of photoelectric converter substrates 1 are bonded to a scintillator 3 by means of adhesive 6 and the input/output terminals 103 of the photoelectric converter substrates 1 are formed on respective surfaces that are different from the light receiving surfaces of the photoelectric converter substrates 1. Each of the photoelectric converter substrates 1 is provided with etched holes 106, through which a leads are extending from the side of the light receiving surface of the photoelectric converter substrate 1 to the rear surface side. A base member 7 provided with slits 70 corresponding to the leads of the photoelectric converter substrates 1 is arranged thereunder and provided with electrodes 700 corresponding to the leads.

Figure 18A:
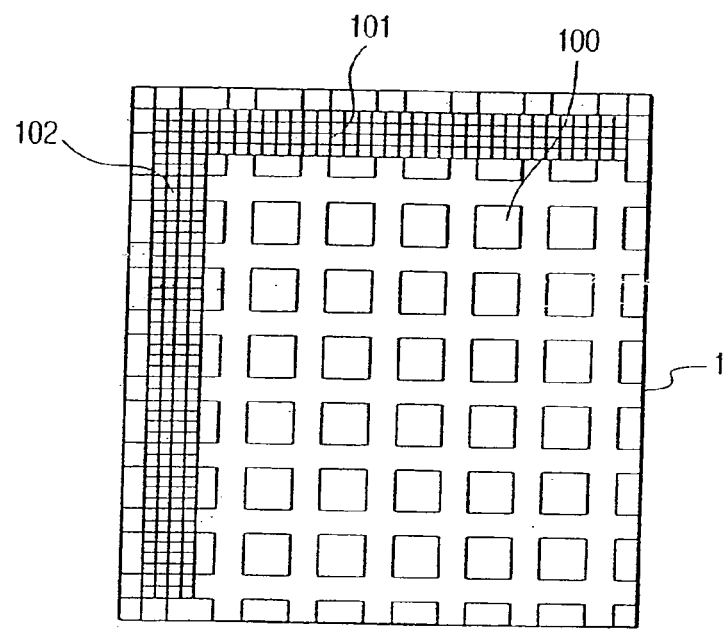
FIG. 18A is a schematic plan view of one of the photoelectric converter substrates 1 of the embodiment of FIG. 16.
Figure 18B:
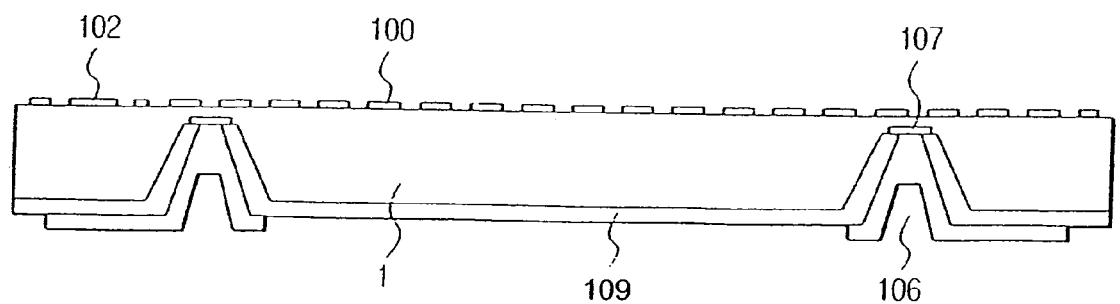
FIG. 18B is a schematic cross sectional view corresponding to FIG. 18A.

FIG. 18A is a schematic plan view of one of the photoelectric converter substrates 1 of the embodiment and FIG. 18B is a schematic cross sectional view corresponding to FIG. 18A.

Light receiving pixels (photoelectric converters) 100 are arranged two-dimensionally on the silicon substrate 1. Additionally, drive circuits 101, 102 for sequentially driving the two-dimensionally arranged light receiving pixels and wires for connecting the circuits, the pixels and the electrode terminals are formed on the silicon substrate 1.

The light receiving pixels 100 are arranged almost on the entire surface of the photoelectric converter substrate 1 at a pitch of 100 μm. The drive circuits 101, 102 are arranged so as to separate pixels.

FIGS. 19A through 19D are schematic cross sectional lateral views of one of the photoelectric converter substrates 1 of the embodiment, showing manufacturing steps for taking out an input/output terminal 103 from the rear surface of the photoelectric converter substrate 1.

(Step 1 Polishing of Rear Surface)

Figure 19A:
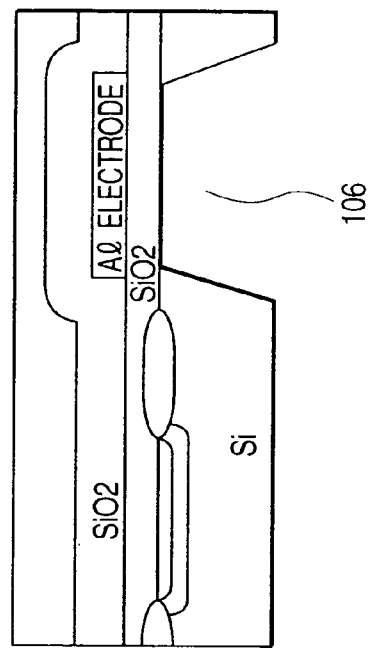
FIGS. 19A, 19B, 19C and 19D are schematic cross sectional lateral views of the embodiment of FIG. 16, showing a part thereof to illustrate different manufacturing steps.

Firstly, as shown in FIG. 19A, the photoelectric converter substrate 1 is held to a holding substrate typically by means of wax and polished at the rear surface thereof by about 100 μm in order to curtail the time required for the etching process.

(Step 2 Formation of Etching Mask and Etching)

Figure 19B:
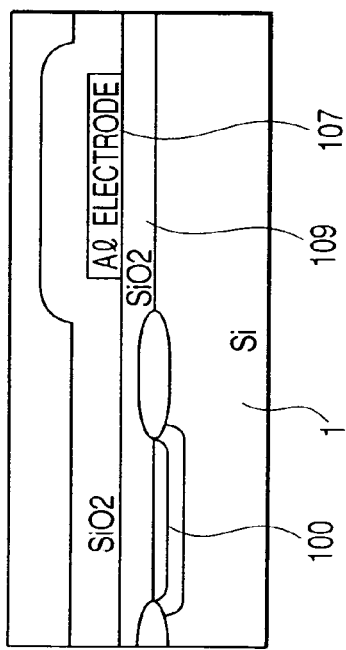

Then, as shown in FIG. 19B, Al electrode 107 is etched as corresponding to an input/output terminal 103. The etching operation proceeds, using an $SiO_2$ film 108 that is an alkali-resistant material as silicon wafer etching mask because the etching operation is conducted in a strongly alkali solution.

Thereafter, only the rear surface where the etching operation is conducted is exposed and the photoelectric converter substrate 1 is immersed into an aqueous solution of TMAH (tetramethyl hydroxide) heated to 80° C. for about 2 hours to complete the etching operation while all the remaining surfaces are covered by silicon rubber in order to fend off the etching solutions trying to touch them. Since an $SiO_2$ film is formed on the electrode, the etching operation terminates at the $SiO_2$ film 108 even if the photoelectric converter substrate is over-etched.

(Step 3 Formation of Insulating Layer and through Hole)

Figure 19C:
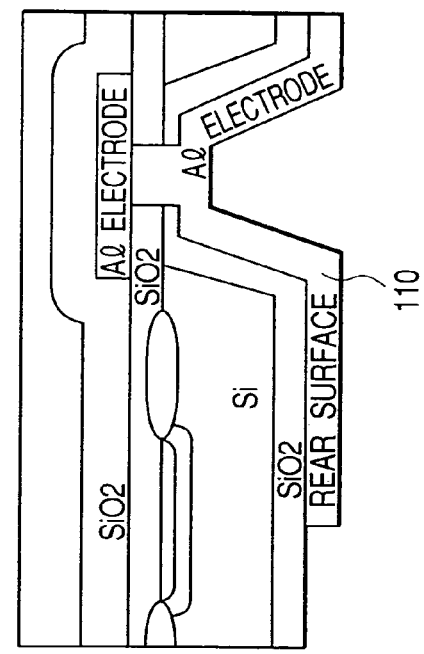

Subsequently, as shown in FIG. 19C, an insulating layer 109 is formed on the etched surface in order to prevent any leakage of electricity to the electrode because the etched surface is that of a silicon semiconductor. More specifically, a 0.2 µm thick $SiO_2$ film layer is formed by CVD, although the $SiO_2$ film may be replaced by a film layer of an organic material such as polyimide so long as it can effectively prevent any leakage of electricity from occurring.

Then, the insulating layer and the film of the alkali-resistant material is removed so that the hole 106 formed by etching gets to the electrode 107. More specifically, a mask is formed by using photoresist and then the through hole is produced by RIE.

(Step 4 Formation of Rear Surface Electrode)

Figure 19D:
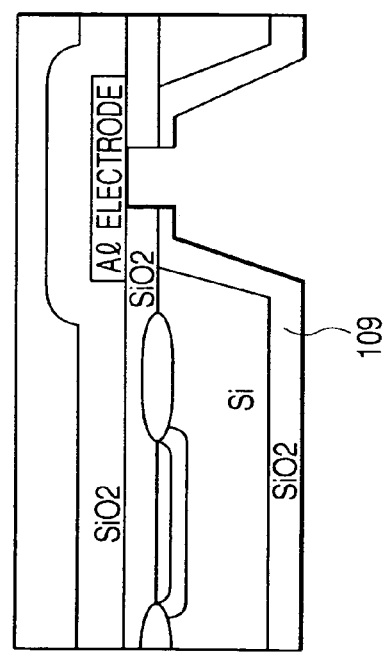

Thereafter, as shown in FIG. 19D, the exposed electrode 107 is taken out to the rear surface of the photoelectric converter surface 1 to produce a rear surface electrode 110 by forming an aluminum film and patterning the formed aluminum film.

(Step 5 Bonding External Circuit Substrate)

Then, in Step 5 (not shown), the photoelectric converter substrates 1 are arranged side by side on the base member 7. The base member 7 is formed by using a ceramic substrate, taking the thermal expansion coefficient and the rigidity of the photoelectric converter substrates 1 into consideration. The base member 7 carries thereon an A/D converter, electrodes to be connected to the respective input/output terminals of the photoelectric converter substrates and slits 70 for connecting the photoelectric converter substrates 1 and the electrodes on the base member 7 that are formed in advance. The base member 7 and the photoelectric converter substrates 1 are arranged in such a way that the slits 70 and the corresponding electrodes of the photoelectric converter substrates 1 are aligned relative to each other and then bonded together. Then, the flexible circuit substrates are made to extend through the slits by way of leads and the input/output terminals and the corresponding electrodes are connected to each other. The photoelectric converter substrates are arranged with gaps of 80 µm, considering the possible alignment errors and the pitch of arranging the pixels.

Silicone resin showing a high modulus of elasticity is used as adhesive so that the photoelectric converter substrates may remain free from stress. The rear surface electrodes 110 formed on the photoelectric converter substrates 1 and the electrodes formed on the base member 7 are connected respectively and the wires are protected by a sealing material. In this step, electronic parts 71 including processing circuits are also mounted on the device.

CMOS elements are preferably used for the photoelectric converters.

A complete radiation image pickup device can be formed by laying a scintillator 3 (gadolinium sulfide: GdS or cesium iodide: CsI) for shifting the wavelength of radiation on the light receiving surfaces. More specifically, a scintillator sheet prepared by sandwiching a sheet of GdS between a pair of PET (polyethyleneterephthalate) films and shaping the multilayer product is bonded to the photoelectric converter substrates 1 by means of light transmitting adhesive.

The reliability of the prepared radiation image pickup device can be improved by using a radiation shielding member 9 such as a fiber plate of lead glass that transmits light and absorbs radiation between the scintillator layer 3 and the photoelectric converter substrates 1 in order to prevent any leaked X-rays that are not absorbed by the scintillator layer 3 from entering the photoelectric converter substrates 1 to degrade the operation characteristics and produce operation errors.

Additionally, as in the first embodiment, a light transmitting substrate such as an optical fiber plate may be arranged between the scintillator layer and the light receiving surfaces of the photoelectric converters to improve the efficiency of light detection.

(Fourth Embodiment)

Figure 22A:
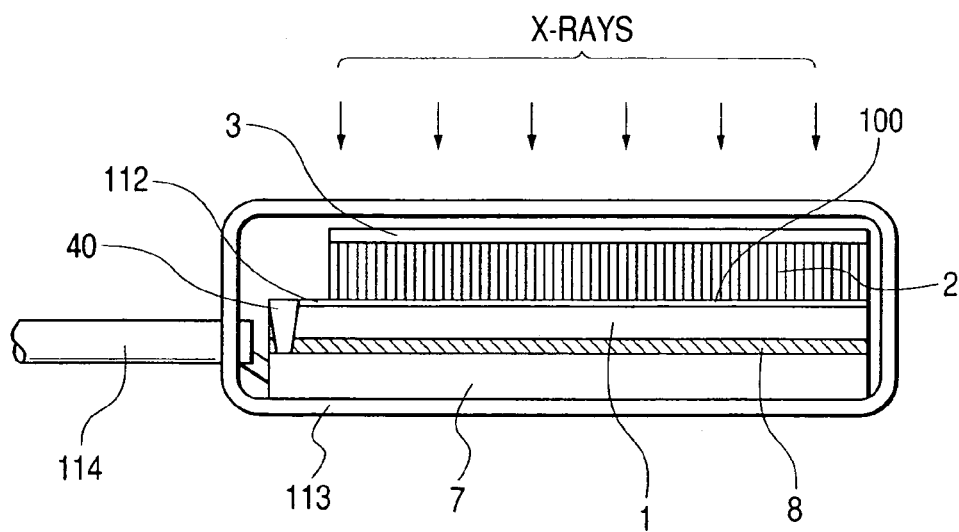
FIG. 22A is a schematic cross sectional lateral view of the embodiment of FIG. 21.
Figure 22B:
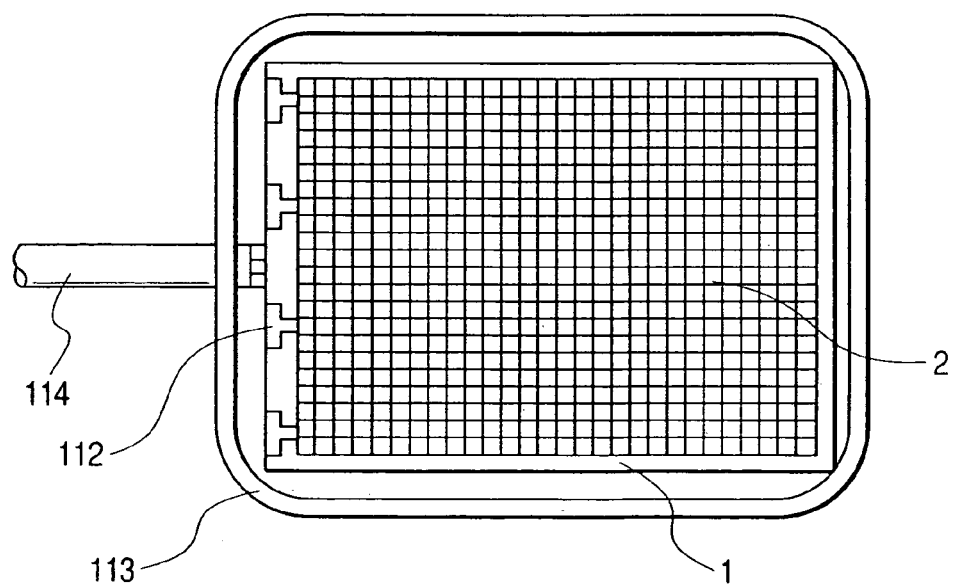
FIG. 22B is a schematic cross sectional plan view of the embodiment of FIG. 21.

FIG. 21 is a schematic perspective view of the fourth embodiment of image pickup device according to the invention and FIGS. 22A and 22B are schematic cross sectional views of the embodiment of FIG. 21. FIG. 22A is a schematic longitudinal cross section view of the embodiment taken along line 22A—22A in FIG. 21, whereas FIG. 22B is a schematic transversal cross sectional view of the embodiment taken along line 22B—22B in FIG. 21.

In this embodiment, an electrode is made to run through each photoelectric converter substrate 1 and extend to the rear surface side in order to draw the information detected by the photoelectric converter substrate 1 to the outside of the sensor by way of a cable. In FIG. 21, reference numeral 111 denotes a radiation image sensor. In FIGS. 22A and 22B, there are shown a CMOS image pickup element substrate 1, which is a sort of an image pickup element, a light receiving pixel section 100 formed on the CMOS image pickup element substrate 1, a wiring circuit section 112 formed on the CMOS image pickup element substrate 1, a through electrode 40 connected to the wiring circuit section 112, an FOP 2 for transmitting visible light, a scintillator 3 for converting visible light into an electromagnetic wave that can be detected by the CMOS image pickup element, adhesive 8 for rigidly holding and electrically connecting the CMOS image pickup element substrate 1 to a base member 7, a case 113 and a cable 114 for drawing electric signals to the outside. Anisotropic electrically conductive adhesive is preferably used for the adhesive.

Figure 23A:
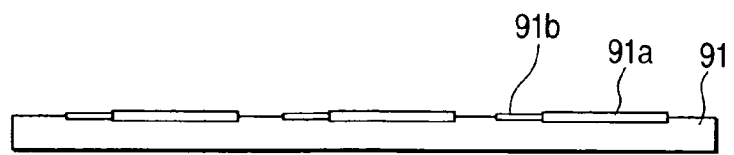
FIGS. 23A, 23B, 23C, 23D and 23E are schematic views of the embodiment of FIG. 21, showing a part thereof to illustrate different manufacturing steps.
Figure 23B:
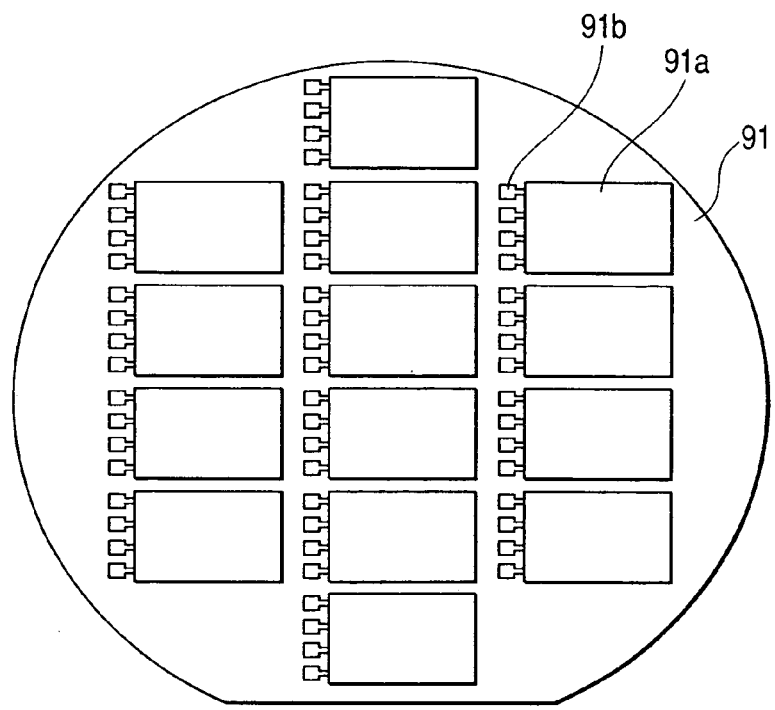

Now, the process of preparing the CMOS image pickup element substrate 1 will be described by referring to FIGS. 23A through 23E, of which FIGS. 23A and 23C through 23E are schematic cross sectional views of a semiconductor wafer and FIG. 23B is a schematic plan view of the semiconductor wafer of FIG. 23A.

Firstly, as shown in FIGS. 23A and 23B, a light receiving pixel section 91a, a processing circuits including a drive circuit and an output circuit (not shown) and a wiring circuit 91b are formed on a semiconductor wafer 91 by means of an ordinary semiconductor process.

Figure 23C:
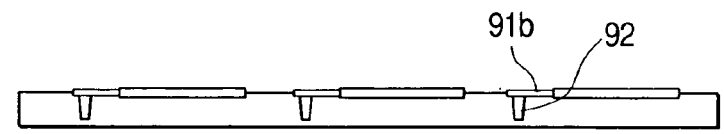
Figure 23D:
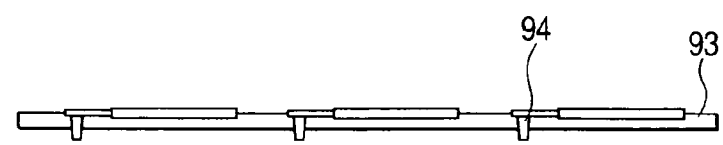

Then, as shown in FIG. 23C, a hole 92 that is deep but does not run through the wiring circuit section 91 is formed in the latter typically by anisotropic etching and an insulating layer and an electrically conductive layer connected to the wiring circuit section 91b are formed on the inner surface of the deep hole. Subsequently, as shown in FIG. 23D, the semiconductor wafer 91 is etched from the rear surface 93 until the electrically conductive layer connected to the wiring circuit section 91b is exposed to produce a through electrode 94.

Figure 23E:
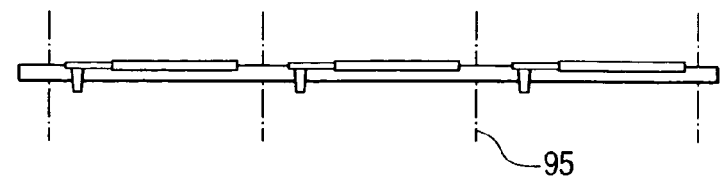

Finally, as shown in FIG. 23E, the semiconductor wafer is diced to predetermined chip dimensions along the dicing lines 95 as indicated by chain lines in FIG. 23E.

A radiation image pickup device for dental applications obtained by mounting such CMOS image pickup elements is compact and shows a very small peripheral non-effective surface area if compared with a device realized by mounting conventional image pickup elements. Such image pickup elements and peripheral circuit sections are arrenged on a single substrate.

Figure 24:
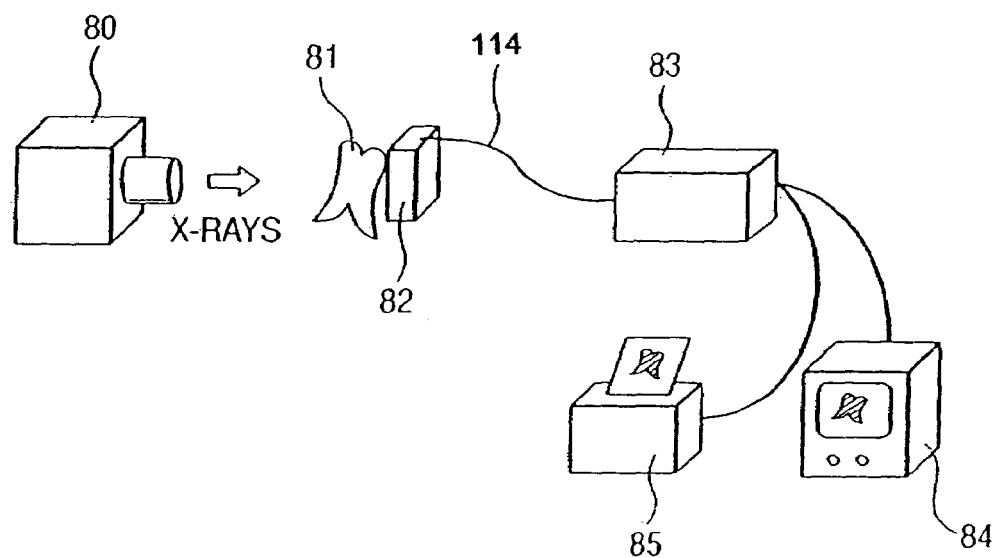
FIG. 24 is a schematic illustration of a radiation image pickup system that can be realized by using an image pickup device according to the invention.

The prepared radiation image pickup device 200 can be used as radiation image sensor 82 of a radiation image pickup system as shown in FIG. 24. With such a system, X-rays from an X-ray source 80 are made to strike the dental X-ray image sensor 82 (X-ray image sensor 10) arranged behind the teeth to be examined in the oral cavity after passing through the teeth 81 in a manner as described earlier. Then, as shown in FIG. 22A, the wavelength of the incident radiation is changed to that of visible light by the scintillator 3 and the obtained visible light is projected onto the light receiving pixel section 100 of the CMOS image pickup elements by way of the FOP (fiber optical plate) 2. Then the visible light is converted into an electric signal by the peripheral circuit section and transmitted to a control unit 83 by way of the through electrodes 40 and the cable 114. The signal is then subjected to A/D conversion and processed to produce an image of the teeth in the control unit 83, which is then displayed on a monitor display 84 or printed by a printer 85. The obtained image is then used for dental care.

(Fifth Embodiment)

Figure 25:
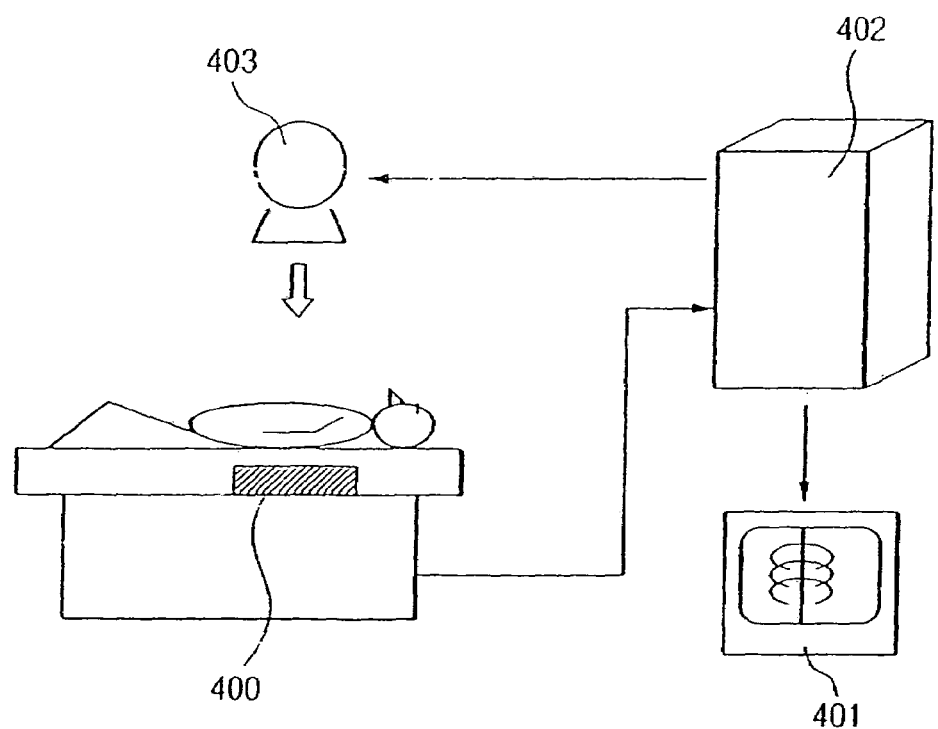
FIG. 25 is a schematic conceptual illustration of an embodiment of image processing system according to the invention.

FIG. 25 is a schematic conceptual view of an image processing system according to the invention. The system will be described here particularly in terms of X-rays. An X-ray image of the object is transmitted from a radiation image pickup device 400 to an image processor 402, which processes the image for the purpose of emphasizing the contrast and coloring. The processed image is then displayed on a display unit 401. X-rays may be emitted further from X-ray generator 403 according to an instruction from the image processor 402 typically in order to change the angle of shooting the object and produce another X-ray image. With such a system, it is possible to shoot a small area such as molars and show a moving image thereof.

What is claimed is:

1. A radiation image pickup device having a plurality of photoelectric converters and a plurality of photoelectric converter substrates carrying respective terminals connected to said photoelectric converters on light receiving surfaces of the photoelectric converter substrates, said device further comprising:
    leads connected to the terminals and extending to a side opposite to the light receiving surfaces of the photoelectric converter substrates through gaps between the substrates; and
    a wavelength converter for wavelength-converting radiation and a light guide section for guiding light from said wavelength converter to said plurality of photoelectric converters, said wavelength converter and said light guide section being provided with the plurality of photoelectric converter substrates.

* * * * *

UNITED STATES PATENT AND TRADEMARK OFFICE
CERTIFICATE OF CORRECTION

| | |
|---|---|
| PATENT NO. | : 7,129,458 B2 |
| APPLICATION NO. | : 10/923810 |
| DATED | : October 31, 2006 |
| INVENTOR(S) | : Osamu Hamamoto et al. |

It is certified that error appears in the above-identified patent and that said Letters Patent is hereby corrected as shown below:

ON COVER PAGE AT (57) ABSTRACT

Line 6, "thorough" should read --through--.

COLUMN 1

Line 55, "above described" should read --above-described--.

COLUMN 3

Line 3, "above identified" should read --above-identified--; and
Lines 31-53 should be deleted.

COLUMN 4

Line 12, "substrate" should read --substrates--.

COLUMN 7

Line 4, "and" should read --and is--.

COLUMN 10

Line 19, "a" should be deleted.

COLUMN 12

Line 46, "a" (first occurrence) should be deleted.

UNITED STATES PATENT AND TRADEMARK OFFICE
CERTIFICATE OF CORRECTION

| | | |
|---|---|---|
| PATENT NO. | : 7,129,458 B2 | Page 2 of 2 |
| APPLICATION NO. | : 10/923810 | |
| DATED | : October 31, 2006 | |
| INVENTOR(S) | : Osamu Hamamoto et al. | |

It is certified that error appears in the above-identified patent and that said Letters Patent is hereby corrected as shown below:

COLUMN 13

Line 2, "arrenged" should read --arranged--.

Signed and Sealed this

Twenty-fifth Day of March, 2008

JON W. DUDAS
*Director of the United States Patent and Trademark Office*